US012119791B2

(12) United States Patent
Jussila et al.

(10) Patent No.: US 12,119,791 B2
(45) Date of Patent: Oct. 15, 2024

(54) LOW NOISE AMPLIFIER

(71) Applicant: Nordic Semiconductor ASA, Trondheim (NO)

(72) Inventors: Jarkko Jussila, Trondheim (NO); Pete Sivonen, Trondheim (NO)

(73) Assignee: Nordic Semiconductor ASA, Trondheim (NO)

( * ) Notice: Subject to any disclaimer, the term of this patent is extended or adjusted under 35 U.S.C. 154(b) by 567 days.

(21) Appl. No.: 17/402,321

(22) Filed: Aug. 13, 2021

(65) Prior Publication Data
US 2022/0052652 A1    Feb. 17, 2022

(30) Foreign Application Priority Data

Aug. 13, 2020 (GB) .................................... 2012658

(51) Int. Cl.
*H03F 1/56* (2006.01)
*H03F 1/22* (2006.01)
*H03F 1/26* (2006.01)
*H03F 3/45* (2006.01)

(52) U.S. Cl.
CPC .............. *H03F 1/26* (2013.01); *H03F 1/223* (2013.01); *H03F 1/565* (2013.01); *H03F 3/45475* (2013.01); *H03F 2200/267* (2013.01); *H03F 2200/294* (2013.01); *H03F 2200/451* (2013.01)

(58) Field of Classification Search
CPC . H03F 1/26; H03F 1/223; H03F 1/565; H03F 3/45475; H03F 2200/267; H03F 2200/294; H03F 2200/451
USPC .......................................... 330/311, 98, 126
See application file for complete search history.

(56) References Cited

U.S. PATENT DOCUMENTS

| | | | | |
|---|---|---|---|---|
| 6,208,206 B1 * | 3/2001 | Leung | ..................... | H03F 1/086 330/109 |
| 6,724,253 B2 * | 4/2004 | Hau | ...................... | H03F 1/3276 330/144 |
| 7,948,309 B2 * | 5/2011 | Mak | ....................... | H03F 1/083 330/98 |
| 8,058,931 B1 | 11/2011 | Zhou | | |
| 2002/0057115 A1 * | 5/2002 | Tsecouras | ............ | H03K 3/0231 327/113 |

(Continued)

FOREIGN PATENT DOCUMENTS

CN          110635769 A       12/2019

OTHER PUBLICATIONS

Adabi et al., "CMOS Low Noise Amplifier with Capacitive Feedback Matching," *IEEE 2007 Custom Integrated Circuits Conference*, Sep. 2007, 4 pages.

(Continued)

*Primary Examiner* — Andrea Lindgren Baltzell
*Assistant Examiner* — Khiem D Nguyen
(74) *Attorney, Agent, or Firm* — Klarquist Sparkman, LLP

(57) ABSTRACT

A low noise amplifier comprising a first transconductance amplifier arranged to receive an input voltage at its input terminal and to generate an output current at its output terminal. A second transconductance amplifier is arranged such that its input terminal is connected to the input terminal of the first transconductance amplifier, and such that the output terminal of the second transconductance amplifier is connected to the input terminal of the second transconductance amplifier via a capacitive feedback network ($C_1$).

19 Claims, 13 Drawing Sheets

(56) References Cited

U.S. PATENT DOCUMENTS

| | | |
|---|---|---|
| 2005/0083127 A1* | 4/2005 | Moraveji .............. H03F 3/3022 |
| | | 330/264 |
| 2009/0309653 A1* | 12/2009 | Luff .................. H03H 11/1295 |
| | | 330/9 |
| 2013/0314160 A1 | 11/2013 | Tsai et al. |
| 2014/0266461 A1 | 9/2014 | Youssef et al. |
| 2015/0035602 A1 | 2/2015 | Mattisson et al. |
| 2015/0341075 A1 | 11/2015 | Heikkinen et al. |
| 2018/0358992 A1* | 12/2018 | Fernando ............. H04B 1/0057 |
| 2019/0334504 A1 | 10/2019 | Park et al. |

OTHER PUBLICATIONS

Beffa et al., "A Receiver for WCDMA/EDGE Mobile Phones with Inductorless Front-End in 65nm CMOS," *2011 IEEE International Solid-State Circuits Conference*, Digest of Technical Papers, Feb. 23, 2011, pp. 370-372.

IPO Search Report under Section 17(5), mailed Nov. 20, 2020, 5 pages.

Murphy et al., "A Blocker-Tolerant, Noise-Cancelling Receiver Suitable for Wideband Wireless Applications," *IEEE Journal of Solid-State Circuits*, vol. 47, No. 12, Dec. 2012, 21 pages.

Valla et al., "A 72-mW CMOS 802.11a Direct Conversion Front-End With 3.5-dB NF and 200-KHz 1=f Noise Corner," *IEEE Journal of Solid-State Circuits*, vol. 40, No. 4, Apr. 2005, 8 pages.

\* cited by examiner

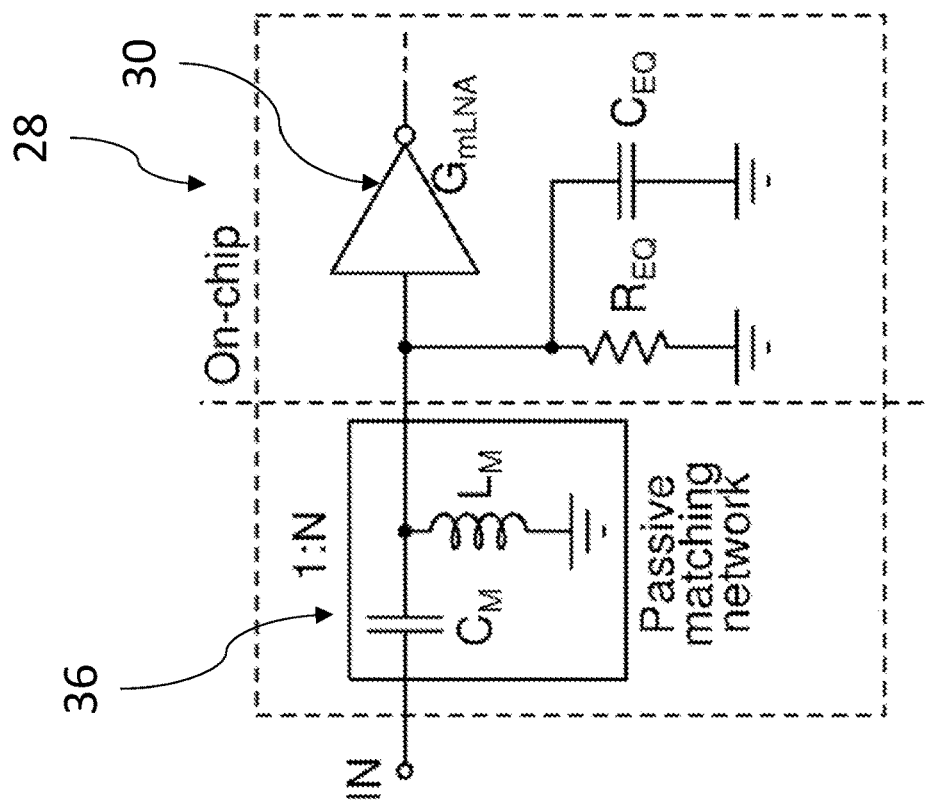
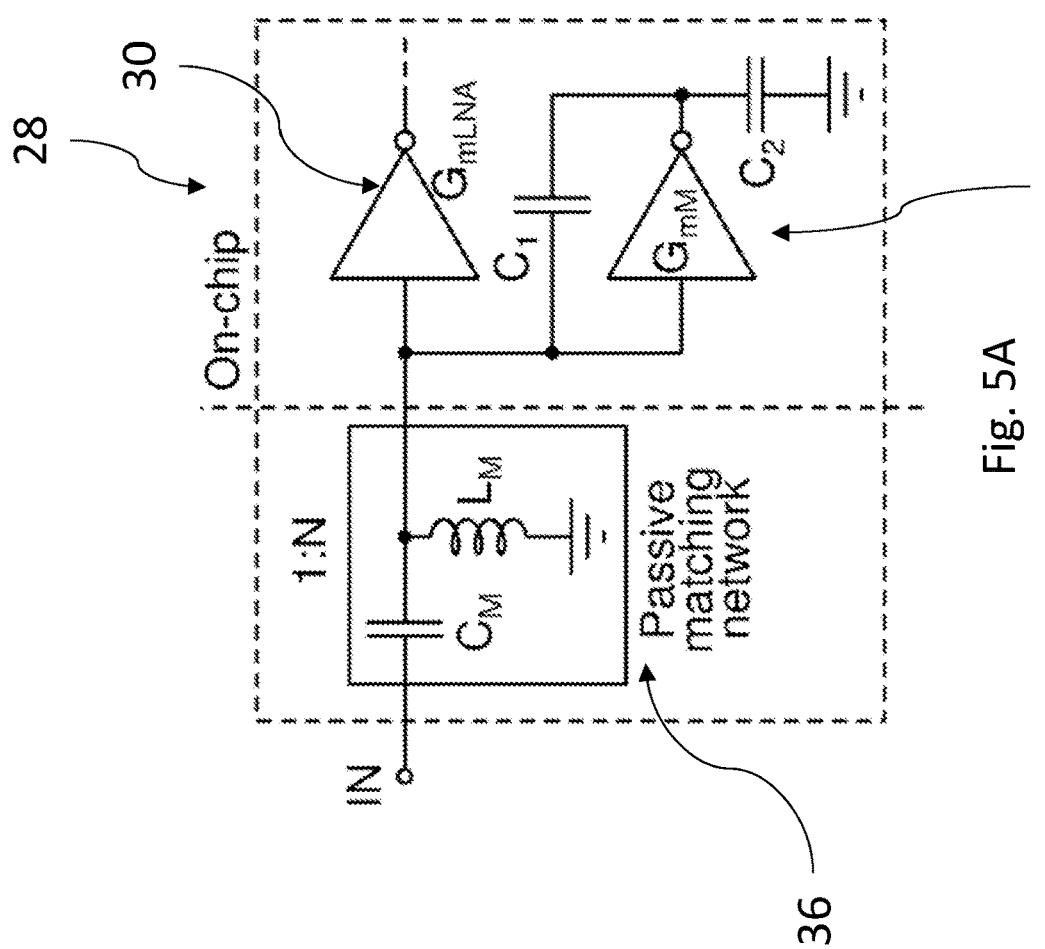
Fig. 5B
Fig. 5A

LOW NOISE AMPLIFIER

CROSS REFERENCE TO RELATED APPLICATION

This application claims priority to GB 2012658.7, filed Aug. 13, 2020, which application is incorporated herein by reference in its entirety.

TECHNICAL FIELD

The present invention relates to low noise amplifiers, particularly but not exclusively low noise amplifiers suitable for use in wireless receivers.

BACKGROUND

Modern radio frequency (RF) transceivers are typically employed in a wide variety of wireless communication devices, such as cellular phones, tablets, and laptops. Generally, conventional RF transceivers are usually highly-integrated devices, in which most of the transceiver circuits and blocks are integrated on a radio frequency integrated circuit (RFIC). In addition, due to its high integration level, the radio receiver can be area-effectively implemented as a direct-conversion receiver. Typically, the integrated direct conversion receiver is preceded by an off-chip passive RF filter.

An integrated direct conversion receiver is typically constructed from a low-noise amplifier (LNA), in-phase and quadrature-phase (IQ) down-conversion mixers, a local oscillator (LO) circuit that generates the down-converting IQ signals for the mixer, an analogue baseband circuit (ABB) including an analogue baseband low-pass filters with amplification, analogue-to-digital converters (ADCs), and a digital circuit for processing the output signals of the ADCs.

In a typical transceiver, known in the art per se, an RF preselection filter is needed in order to filter and attenuate harmful out-of-band blocking signals, which can drive the receiver into compression. These blocking signals may also desensitize the receiver and lower the signal-to-noise-ratio (SNR) of the desired received RF signal. These blocking signals may be signals relating to other communication channels.

Many modern wireless electronic devices and Internet-connected devices employ cellular communication chipsets, such as 3G, 4G, or Long Term Evolution (LTE) chipsets. Such devices include RF transceivers which generally need to support large number of frequency bands, for example to cover different areas and countries. Accordingly, in conventional multiband wireless receivers, multiple RF preselection filters and LNAs are needed in order to provide this wideband coverage. These RF preselection filters are typically expensive, external off-chip components. When implementing a practical device, each frequency reception band generally requires a dedicated RF filter. As a result, conventional multiband radio receivers may be physically bulky and expensive.

For some transceivers, for example half-duplex RF transceivers, the transceivers do not transmit and receive signals simultaneously, and thus the receiver may not have to accommodate relatively large signals from the transmitter. As such, the requirements for accommodating blocking signals may be sufficiently relaxed that the receiver may be able to receive signals into a wideband LNA without the preselection filtering stage. Typically, integrated LNAs employ on-chip inductors, for example at their load, to tune out the parasitic capacitances and to place the peak LNA gain at the frequency of interest. These inductive loads may also allow for larger voltage headroom for blocking signals, which is especially important in an LNA without any preselection filter.

However, the Applicant has appreciated that these on-chip inductors require a significant amount of silicon area. This area is not, in practice, reduced even when the minimum transistor length is scaled down in CMOS process scaling. Thus the relative cost of on-chip inductors compared to any other components used in the RFIC increases with the CMOS process scaling in modern deep-submicron processes. In fact, on-chip inductors may occupy the largest area in integrated LNAs. Due to the large area of silicon required, on-chip inductors may also pick up interference such as digital clock harmonics via magnetic coupling, which can be a serious issue in system-on-chips (SoCs) that usually contain large amount of digital circuitry.

For these reasons, the Applicant has appreciated that it would be desirable to implement the LNA without any on-chip inductors, while providing impedance matching for circuitry connected to the input of the LNA. It is therefore an object of the invention to provide an improved LNA and associated radio receiver device.

SUMMARY OF THE INVENTION

When viewed from a first aspect, the present invention provides a low noise amplifier (LNA) comprising:
  a first transconductance amplifier having an input terminal and an output terminal, said first transconductance amplifier being arranged to receive an input voltage at its input terminal and to generate an output current at its output terminal;
  a second transconductance amplifier having an input terminal and an output terminal, said second transconductance amplifier being arranged such that:
  the input terminal of the second transconductance amplifier is connected to the input terminal of the first transconductance amplifier; and
  the output terminal of the second transconductance amplifier is connected to the input terminal of the second transconductance amplifier via a capacitive feedback network.

This first aspect of the invention extends to a radio receiver device comprising:
  a wireless reception portion arranged to receive a wireless communication signal over a wireless interface, and to generate an input voltage in response to said received communication signal; and
  a low noise amplifier (LNA) comprising:
    a first transconductance amplifier having an input terminal and an output terminal, said first transconductance amplifier being arranged to receive the input voltage at its input terminal and to generate an output current at its output terminal;
    a second transconductance amplifier having an input terminal and an output terminal, said second transconductance amplifier being arranged such that:
    the input terminal of the second transconductance amplifier is connected to the input terminal of the first transconductance amplifier; and
    the output terminal of the second transconductance amplifier is connected to the input terminal of the second transconductance amplifier via a capacitive feedback network.

Thus it will be appreciated that embodiments of the present invention provide an improved LNA constructed from a pair of transconductance amplifiers, and an associated wireless receiver device that incorporates the LNA. The first and second transconductance amplifiers, and the capacitive feedback network, are preferably located on the same die. The first transconductance amplifier (having a respective transconductance $G_{mLNA}$) provides the primary amplification functionality of the LNA, while the second transconductance amplifier (having a respective transconductance $G_{mM}$), which has the capacitive feedback network in its feedback path, provides LNA input matching.

In the LNA of the present invention, the input impedance may be matched to a source impedance of $R_S$ using the parallel second transconductance stage (i.e. the second transconductance amplifier) connected to the input of the LNA. Thus the first transconductance amplifier can have large input and output impedances, and the second transconductance amplifier sets the input impedance of the LNA as a whole. The equivalent resistance of the LNA may, at least in some embodiments, be tuned to be greater than source impedance (i.e. the impedance of the circuitry connected to the input of the LNA), where an impedance matching network between the LNA and preceding circuitry to match the LNA input impedance to the source impedance may be provided to allow this, as outlined below.

The Applicant has appreciated that in resistive- and capacitive-feedback (CFB) LNAs, known in the art per se, the feedback is in the signal path of the LNA, which may lead to limited linearity with a low supply voltage. By way of contrast, the LNA of the present invention includes a second transconductance amplifier stage in parallel with the amplification stage, i.e. the first transconductance amplifier, where the second transconductance amplifier forms a CFB amplifier. In other words, the feedback is connected in parallel with the actual signal path. The CFB amplifier is not used to significantly amplify the desired signal in the receiver signal chain but instead acts to match the LNA input to the source impedance $R_S$.

Conversely, the first transconductance amplifier may, in some embodiments, be feedback-less, i.e. there may be no connection between the input and output terminals of the first transconductance amplifier.

The LNA topology of the present invention has a number of benefits over conventional LNA topologies known in the art.

A radio receiver that incorporates the LNA in accordance with embodiments of the present invention may advantageously have a relatively low noise figure (NF), when compared to conventional receivers, known in the art per se. This may be achieved by using a relatively high transconductance value for the second transconductance amplifier to lower its noise with input matching circuit, and by utilising a sufficiently large transconductance value for the first transconductance amplifier to lower its noise and the circuit following it, e.g. mixers, analogue baseband (ABB) circuitry, etc. The capacitive divider beneficially allows for the use of a high transconductance value for the second transconductance amplifier.

A receiver incorporating an LNA in accordance with some embodiments of the invention may also have a large output impedance of the first transconductance amplifier, which may also reduce the noise contribution of the transimpedance amplifiers (TIAs) where provided, which may also improve the NF of the complete receiver.

When the output of the first transconductance amplifier is connected to a low impedance, any out-of-band blocking signals will create a small voltage swing at the output of the first transconductance amplifier ($G_{mLNA}$), which improves the linearity of a radio receiver device incorporating the LNA of the present invention. These blocking signals are amplified to the output of the second transconductance amplifier ($G_{mM}$), but with a much lower voltage gain compared to conventional resistive feedback (RFB) or capacitive feedback (CFB) LNA topologies known in the art per se, which leads to less compression at the output of the second transconductance amplifier ($G_{mM}$).

In the LNA of the present invention, the transconductance amplifier and associated capacitive feedback employed to provide input matching (i.e. the second transconductance amplifier) is arranged in parallel with the actual signal path (i.e. the path through the first transconductance amplifier). As such, its compression is of less concern compared to the conventional RFB or CFB LNAs, in which the compression takes place at the signal path. As a result, the proposed LNA may achieve much higher linearity compared to traditional RFB or CFB LNA, particularly when a low supply voltage is used. The use of low supply voltage may be particularly desirable in low power applications, such as in battery-powered devices including but not limited to Internet-of-Things (IoT) sensors, which may be installed in remote or difficult-to-reach locations without easy access to a power source.

Furthermore, the LNA topology described herein does not require on-chip inductors and may instead utilise an off-chip input-matching network. On-chip inductors generally pick up interference from e.g. digital clock harmonics via magnetic coupling, which can be a serious issue in system-on-chips (SoCs). For these reasons, it is desirable to implement the LNA without on-chip inductors, which also lowers the cost of an associated RFIC, where implemented. In some embodiments, the first and second transconductance amplifiers and the capacitive feedback network are arranged on a chip, and in some such embodiments the chip comprises an RFIC. Where no on-chip inductors are used, low silicon area and cost is available.

Thus, embodiments of the present invention provide an LNA architecture suitable for wireless receivers which does not require any on-chip inductors. In the LNA topology of the present invention, the LNA input matching is realized with the parallel CFB amplifier (i.e. the second transconductance amplifier $G_{mM}$) with capacitive feedback while the first transconductance amplifier $G_{mLNA}$ drives the following circuitry (e.g. current mode passive mixers as outlined below) with voltage-to-current conversion gain.

In accordance with embodiments of the present invention, the actual amplifier $G_{mLNA}$ that drives following circuitry is realised as a transconductance amplifier (i.e. a voltage-to-current amplifier), which has large input and output resistance. Those skilled in the art will appreciate that the following circuitry driven by the LNA will depend on the overall radio architecture. However, the Applicant has appreciated that the LNA disclosed herein is particularly beneficial for driving mixers and thus, in at least some embodiments the LNA is arranged to drive a mixer, and in some such embodiments the mixer comprises a current-mode passive mixer. The LNA may drive a plurality of mixers, e.g. a plurality of current-mode passive mixers. Accordingly, the radio receiver device may comprise one or more mixers, e.g. current-mode passive mixers.

In a set of such embodiments, the output of the mixer is connected to a transimpedance amplifier (TIA). Where multiple mixers are provided, the respective outputs of one or more of these mixers may be connected to a respective TIA, and the output of each mixer may be connected to its own TIA. Those skilled in the art will appreciate that a transimpedance amplifier is a current-to-voltage amplifier. This TIA may be a differential amplifier (i.e. having inverting and non-inverting inputs and outputs), and may have an associated feedback network comprising a TIA feedback resistance and a TIA feedback capacitance. A feedback network may be provided for each of the TIA's outputs, i.e. for the inverting and non-inverting outputs of the TIA, where each feedback network comprises a respective TIA feedback resistor and TIA feedback capacitor between the inverting input and the non-inverting output, and between the non-inverting input and the inverting output.

As the amplification is provided by a 'true' transconductance amplifier (i.e. the first transconductance amplifier) with large output impedance, it is possible to achieve a relatively large passive current mode mixer output resistance, which may advantageously minimise the noise and DC offsets of the baseband (BB) TIAs. Thus because the amplifying stage, i.e. the first transconductance amplifier, sees a low impedance towards the mixer due to the frequency translation of the baseband TIA input impedance to RF frequencies by the current mode passive mixers, the out-of-band blocking signals cannot generate excessive voltage swing at the output of the first transconductance amplifier. The low voltage swing at the output of the first transconductance amplifier enables relatively high linearity at that location, which is desirable. Additionally, as the LNA input matching is provided via the second transconductance amplifier with capacitive feedback, the second transconductance amplifier may use a moderate voltage gain so the distortion and compression of this parallel second transconductance amplifier may be of less of concern. As a result, the LNA of the present invention, when used in such applications, may be able to achieve multiband operation with programmable current consumption.

When connected to a mixer (or mixers), frequency translation in the mixer causes the large LNA output impedance to be translated to a large mixer output resistance, which lowers the noise and DC-offsets due to the associated transimpedance amplifiers where appropriate. Additionally, due to frequency translation by the current-mode mixers, the low input impedance of TIAs is translated to the input (i.e. the RF input) of the mixer and to the output of the first transconductance amplifier (i.e. having transconductance $G_{mLNA}$), which may advantageously improve the linearity of LNA.

In some embodiments, the capacitive feedback network comprises a first capacitor connected between the input and output terminals of the second transconductance amplifier, and a second capacitor connected between the output terminal of the second transconductance amplifier and a reference voltage. Preferably the reference voltage is ground. The capacitance values of these first and second capacitors, together with the transconductance of the second transconductance amplifier, determine the equivalent input resistance of the second transconductance amplifier, which in turn sets the resistive part of the input impedance of the LNA. Those skilled in the art will appreciate that these values, and the values of any and all other components used to implement embodiments of the present invention, may be selected in accordance with design parameters and constraints.

The capacitive feedback network may be configurable, i.e. one or more of the capacitors used in the network may have a variable capacitance. The provision of configurable capacitors may allow for multiband operation, such that the capacitance of the feedback network can be tuned for a particular operation band, i.e. for a particular operation frequency. In some embodiments, a ratio between the respective capacitance value of the first capacitor to a sum of the capacitance values of the first and second capacitors of the capacitive feedback network is constant. Thus while the capacitance values themselves may be varied, the ratio between them may be kept constant such that the equivalent input resistance of the LNA and matching network voltage gain N remains substantially constant across the entire operating band range.

In some embodiments, a respective capacitance value of the first capacitor and/or the second capacitor of the capacitive feedback network is configurable. This may be achievable with a variable capacitor, and/or by using a matrix of addressable capacitors that can be switched in or out of connection, thereby varying the effective capacitance of the matrix, i.e. the first and/or second 'capacitors' may comprise a capacitor matrix or capacitor matrices, as appropriate.

In some potentially overlapping embodiments, the capacitive feedback network comprises a third capacitor connected between the input terminal of the second transconductance amplifier and the reference voltage, which may be ground as outlined above. The capacitance of this third capacitor may be configurable, i.e. the third capacitor may be variable or comprise an addressable capacitor matrix.

As outlined above, the LNA may be arranged for use in low power applications, and so it may be advantageous to provide control over the current drawn by the LNA. In some embodiments, the second transconductance amplifier comprises a current control circuit portion arranged to adjust a supply current drawn by said second transconductance amplifier. In accordance with such embodiments, the transconductance $G_{mM}$ of the second transconductance amplifier may be scaled down when the level of the RF signal at the LNA input terminal is sufficiently large, which scales down the supply current drawn by the second transconductance amplifier. In a particular set of embodiments, the capacitance of the capacitive feedback network is variable (e.g. using the techniques outlined above with respect to certain embodiments of the invention), such that the equivalent input resistance and capacitance are kept constant even as the transconductance of the second transconductance amplifier is scaled down. As outlined above, this may be achieved by implementing the first and/or second capacitors of the feedback network as capacitor matrices.

There are a number of transconductance amplifier topologies that may be used with the present invention. However, in some embodiments, each transconductance amplifier comprises an inverter cell comprising a p-channel metal-oxide-semiconductor (PMOS) transistor and an n-channel metal-oxide-semiconductor (NMOS) transistor, arranged such that:

a gate terminal of the PMOS transistor is connected to a gate terminal of the NMOS transistor at an inverter input terminal;

a drain terminal of the PMOS transistor is connected to a drain terminal of the NMOS transistor at an inverter output terminal;

a source terminal of the PMOS transistor is connected to a first rail; and a source terminal of the NMOS transistor is connected to a second rail.

While the gate terminal of the PMOS transistor could be connected directly to the gate terminal of the NMOS transistor at the inverter input terminal, in some such embodiments each of the gate terminals of the PMOS and NMOS transistors is connected to the inverter input terminal via respective DC blocking capacitor. These DC blocking capacitors may act as short circuits at RF frequencies and thus, at RF, the gate terminals of the PMOS and NMOS transistors are connected together from the perspective of the RF signal. These DC blocking capacitors may allow for biasing the NMOS and PMOS transistors at different gate voltages, which may be required depending on the particular devices in use.

These inverter cells are arranged such that the input to the transconductance amplifier is routed to the input to the inverter cell, and the inverter cell supplies the output of that transconductance amplifier. The inverter cell of the first transconductance amplifier may, in some embodiments, be arranged such that the inverter input terminal is connected to the input terminal of the first transconductance amplifier, and such that the inverter output terminal is connected to the output terminal of the first transconductance amplifier. Similarly, the inverter of the second transconductance amplifier may, in some embodiments, be arranged such that the inverter input terminal is connected to the input terminal of the second transconductance amplifier, and such that the inverter output terminal is connected to the output terminal of the second transconductance amplifier.

The transistors of the inverters may comprise metal-oxide-semiconductor field-effect-transistors (MOSFETs). The transistors themselves may be selected in order to achieve particular properties, and in particular, the transistors may be sized in order to achieve a relatively high degree of linearity and/or low noise contribution. It will be appreciated by those skilled in the art that each of the transistors will have an associated transconductance, i.e. the PMOS transistor has an associated transconductance $g_{mPMOS}$ and the NMOS transistor has an associated transconductance $g_{mNMos}$. In some embodiments, the transconductances of the PMOS and NMOS transistors are substantially equal.

The first rail may comprise the positive supply voltage rail, and the second rail may comprise the negative supply voltage rail or ground.

In some embodiments, the LNA comprises an external passive impedance transformation network. It will be appreciated that the term 'external', as used with reference to this passive impedance transformation network, means that the components of the passive impedance transformation network are not integrated on the same die as the on-chip parts of the LNA (i.e. the first and second transconductance amplifiers and capacitive feedback network). An off-chip inductor may advantageously achieve a much greater Q-factor and low loss compared to on-chip inductors used in conventional arrangements.

The passive impedance transformation network may, in some embodiments, comprise a capacitor and an inductor, arranged such that:
- a first terminal of the capacitor is connected to the wireless reception portion;
- a second terminal of the capacitor is connected to the input terminal of the first transconductance amplifier;
- a first terminal of the inductor is connected to the second terminal of the capacitor and to the input terminal of the first transconductance amplifier; and
- a second terminal of the inductor is connected to ground.

This passive impedance transformation network may provide a 1:N ratio, such that an incoming RF voltage is multiplied by a factor of N, and such that the impedance is transformed by a factor of $N^2$, i.e. its impedance transformation factor is $N^2$.

BRIEF DESCRIPTION OF DRAWINGS

Certain embodiments of the invention will now be described, by way of example only, with reference to the accompanying drawings in which:

FIGS. 5A and 5B are circuit diagrams of an LNA provided with an off-chip passive matching network;

DETAILED DESCRIPTION

Figure 1:
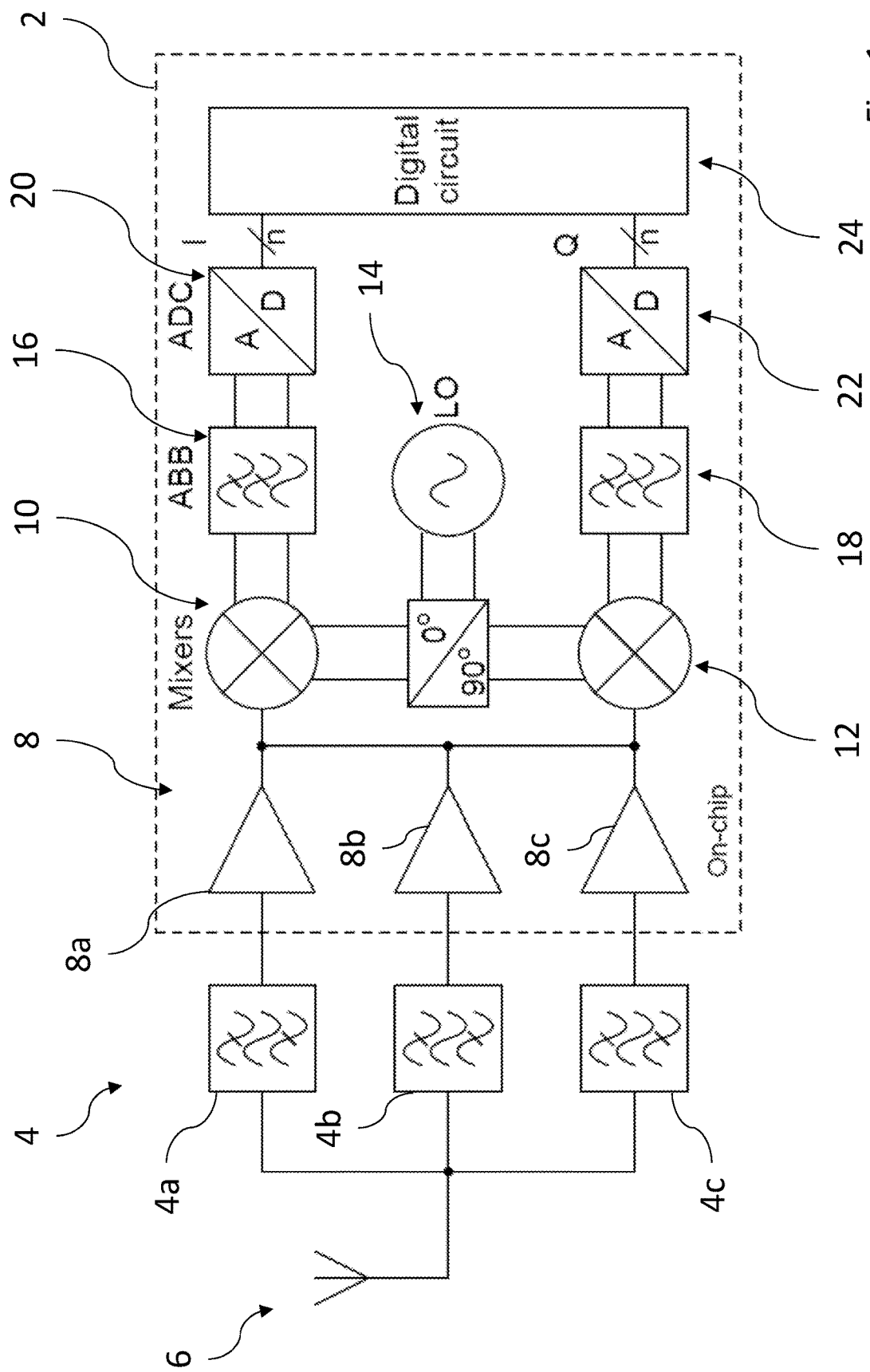
FIG. 1 is a block diagram of a prior art multiband radio receiver.

FIG. 1 is a block diagram of a prior art multiband radio receiver 2. In particular, this radio receiver 2 is implemented as a 'direct conversion receiver'. The integrated direct conversion receiver is shown with dashed lines and it is preceded by an off-chip, passive RF filter 4. In general, this RF 'preselection' filter 4 is needed to filter and attenuate harmful out-of-band blocking signals, which can drive the receiver 2 into compression.

Blocking signals may also desensitize the receiver 2 and lower the signal-to-noise-ratio (SNR) of the desired received RF signal received via the antenna 6. The integrated direct conversion receiver 2 is constructed from an LNA 8; in- and quadrature-phase (IQ) down conversion mixers 10, 12; a local oscillator (LO) circuit 14 that generates the down-converting IQ signals for the mixers 10, 12; an analogue baseband (ABB) circuits 16, 18 that include respective analogue baseband low-pass filtering and amplification; analogue-to-digital converters (ADC) 20, 22; and a digital circuit 24 for processing the output signals of ADCs 20, 22.

Today's wireless terminals and Internet-connected devices employ cellular—e.g. as 3G, 4G, or long term evolution (LTE)—chipsets with RF transceivers which need to support large number of frequency bands covering different areas and countries. As such, the radio receiver device 2 is a multiband wireless receiver, and thus includes multiple RF preselection filters 4a-c, and multiple LNAs 8a-c which are also needed in such an arrangement. In this particular example, the direct conversion receiver 2 of FIG. 1 can support reception at three different frequency bands, where each frequency band requires its own dedicated RF preselection filter 4a-c and associated LNAs 8a-c.

In some frequency-division multiplexing (FDD) radio systems, such as in 3G and 4G cellular systems, the receiver 2 and the transmitter (not shown) of the same RF transceiver simultaneously receive and transmit, i.e. the transceiver carries out full-duplex communication. In such an FDD RF transceiver, the RF preselection filter 4 is generally necessary in order to attenuate the large transmitted signal, which otherwise would leak to the input of the receiver 2 via a common receiver-transmitter antenna 6. In such cases, the receiver RF preselection filter 4 may also be realised as a duplexer filter, which also provides filtering to the transmitter. In practice, it is generally very difficult to omit the receiver RF preselection filter 4 in a full-duplex FDD system, since the level of the transmitted RF signal at the antenna 6 can be very large, e.g. +30 dBm.

Figure 2:
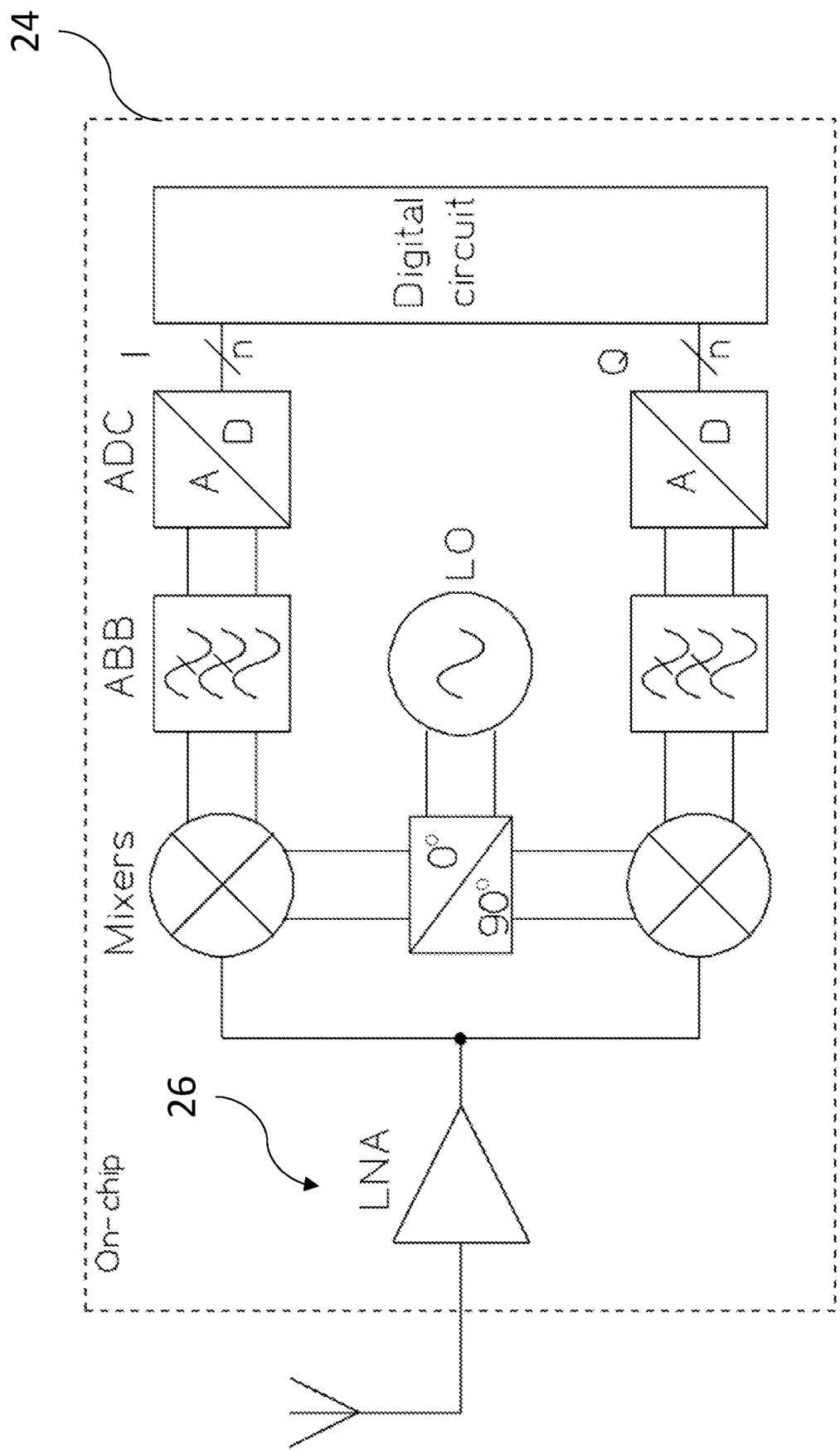
FIG. 2 is a block diagram of a prior art filter-less multiband radio receiver.

However, in half-duplex RF transceivers, the receiver and transmitter do not operate simultaneously, and in such arrangements it may be possible to use a 'filter-less' receiver, such as the one shown in FIG. 2.

In a half-duplex system, the transmitter (not shown) and receiver 24 do not operate simultaneously and, as a result, the receiver 24 does not need to tolerate large RF signal transmitted by the colocated transmitter when receiving (potentially very weak) RF signals. For example, in half-duplex LTE radio systems for Internet-of-Things (IoT) applications, the receiver 24 generally needs to tolerate out-of-band signals of levels up to −15 dBm at the at the antenna port (i.e. the part of the receiver connected to the antenna 6) while providing sufficiently large SNR for the desired received signal. This blocking signal requirement is sufficiently relaxed that the integrated radio receiver 24 may have a sufficiently linear design so as to tolerate these out-of-band blockers without filtering them before they enter to the LNA. If this is the case, it may be possible to omit the RF preselection filters altogether.

In such an arrangement, it may be possible to provide only a single wideband or configurable LNA 26. In this context, configurable means that the LNA 26 can be configured to a desired operation frequency band. However, in practice, if the receiver needs to support wide band of frequencies, it may be necessary to employ more than one configurable LNA (not shown), for instance one LNA covering for low band (LB) frequencies, a second LNA supporting medium band (MB) frequencies, and a third LNA configurable to high band (HB) frequencies. The number of LNAs needed depends on the required operation frequency tuning range of the receiver. Nevertheless, as it is not uncommon for modern multiband receivers to need to support ten or more frequency bands in which a conventional multiband receiver would require ten separate RF preselection filters, ten LNAs, and ten LNA input pins on the RFIC, making use of e.g. three configurable LB, MB, and HB LNAs with no RF preselection filters may lead to much lower complexity and bills of material (BOM).

Such a multiband RF pre-selection filter-less receiver 24 generally requires an LNA architecture which needs to be wideband or configurable to a wide band of frequencies as outlined above. Typically, prior art integrated LNAs employ on-chip inductors, for example at their load, in order to tune out the parasitic capacitances and to cause the peak LNA gain to be at the frequency of interest. In a multiband LNA, a parallel inductor-capacitor (LC) resonance circuit at the LNA's load can be tuned to a wide band of frequencies, e.g. by using a capacitor matrix. In modern sub-micron complementary metal oxide semiconductor (CMOS) processes that use low supply voltages, the use of inductive loads at LNAs also allows for larger voltage headroom for blocking signals, which is especially important in RF preselection filter-less receivers in which there is no filtering for the blocking signals before they enter to the LNA, as outlined above.

Unfortunately, on-chip inductors require a significant amount of silicon area and scaling down the minimum transistor length in CMOS process scaling does not typically lead to a significant reduction in the silicon area required for such on-chip inductors. This means that the relative cost of on-chip inductors compared to any other components used in the RFIC increases with the CMOS process scaling in modern deep-submicron processes. On-chip inductors can potentially occupy the largest area in integrated LNAs. Due to the associated large silicon area requirement, on-chip inductors also pick up interference such as digital clock harmonics via magnetic coupling, which can be a serious issue in system-on-chips (SoCs) that usually contain large amount of digital circuitry. For these reasons, it is desirable to implement the LNA without on-chip inductors, i.e. as an on-chip inductor-less amplifier. Such an arrangement may also lower the cost of the RFIC.

The LNAs typically need to provide a stable input impedance (usually 50Ω for a single-ended LNA, or 100Ω for a differential LNA) for a proper termination impedance for the RF preselection filter or antenna in order to avoid issues. For example, if a RF preselection filter is not terminated with the correct impedance, the filter may exhibit an unacceptably high ripple at its passband and the filter transition band attenuation may be compromised. The LNAs need to also have low noise figure (NF) for high receiver sensitivity and they need to provide sufficiently large gain to suppress the noise of the circuits following the LNA. In modern radio receivers, the down conversion mixers are usually realized as current-mode passive mixers and in that case, it is convenient to define the LNA gain as equivalent transconductance ($g_m$), which represents the RF voltage-to-current gain of the LNA. Finally, especially in RF preselection filter-less receivers, the LNAs typically need to have high linearity to tolerate out-of-band blocking signals.

To this end, conventional LNAs make use of RFB- or CFB-based topologies, known in the art per se, in which the transconductance amplifier of the LNA that provides the required gain is supplied with either resistive or capacitive feedback elements, i.e. feedback is provided in the signal path.

Figure 3B:
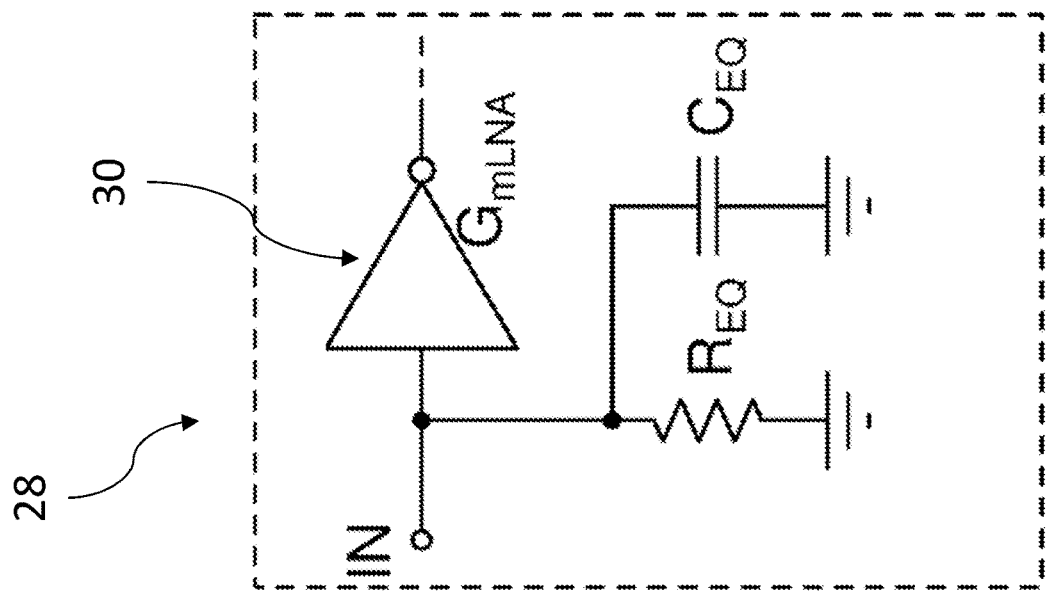
FIG. 3B is a schematic diagram showing an equivalent circuit to the topology of FIG. 3A.
Figure 3A:
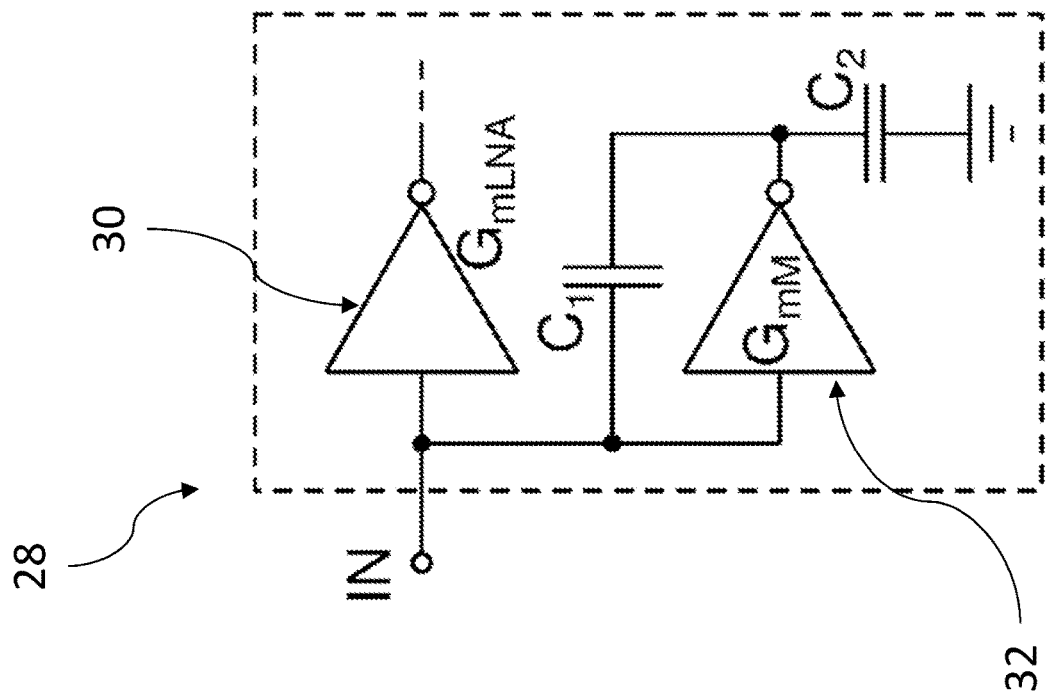
FIG. 3A is a schematic diagram of an LNA in accordance with an embodiment of the present invention.

FIG. 3A is a schematic diagram of an LNA 28 in accordance with an embodiment of the present invention. FIG. 3B is a schematic diagram showing an equivalent circuit to the topology of the LNA 28.

In this arrangement, the LNA 28 is constructed from a pair of transconductance amplifiers 30, 32 arranged in parallel. The first transconductance amplifier 30 has a transconductance $G_{mLNA}$ and is arranged to provide the primary transconductance amplification of the LNA 28, i.e. it provides voltage-to-current gain. This particular transconductance amplifier 30 has no feedback loop.

In parallel with the first transconductance amplifier 30 is a second transconductance amplifier 32, which has a transconductance $G_{mM}$. This second transconductance amplifier 32 has a capacitive feedback network constructed from first and second capacitors $C_1$, $C_2$. The first capacitor $C_1$ is connected between the input and output terminals of the second transconductance amplifier 32, and the second capacitor $C_2$ is connected between the output terminal of the second transconductance amplifier 32 and ground.

The second transconductance amplifier 32, which has the capacitive feedback network in its feedback path, provides input impedance matching for the LNA 28. This advantageously allows the first transconductance amplifier 30 to have large input and output impedances, while the second transconductance amplifier 32 sets the input impedance of the LNA 28 as a whole.

The proposed architecture can be used for both single-ended and differential LNA circuits.

As shown in FIG. 3B, the second transconductance amplifier 32, together with its capacitive feedback network $C_1$, $C_2$, can be seen as an equivalent resistance $R_{EQ}$ and capacitance $C_{EQ}$ connected to the input terminal of the first transconductance amplifier 30, i.e. they influence the effective input impedance of the LNA 28. The values of these equivalent resistance $R_{EQ}$ and capacitance $C_{EQ}$ are derived as per Equations 1 and 2 below respectively.

Equivalent resistance $R_{EQ}$ $$R_{EQ} = \frac{C_1 + C_2}{C_1} \frac{1}{G_{mM}} \qquad \text{Equation 1}$$

Equivalent capacitance $C_{EQ}$ $$C_{EQ} = \frac{C_1 C_2}{C_1 + C_2} \qquad \text{Equation 2}$$

Here, $R_{EQ}$ is the input resistance of the LNA 28 and $C_{EQ}$ is the (undesired) input capacitance of the LNA 28. Assuming that at the frequency of interest ($f_0$), that the angular frequency $$\omega_0 \ll \frac{G_{mM}}{C_2},$$

the input resistance matching requirement $R_{IN}$ of the LNA 28 is given as per Equation 3 below:

Input resistance matching requirement of the LNA 28

$$R_{IN} = R_{EQ} = R_S = \frac{C_1 + C_2}{C_1} \frac{1}{G_{mM}} \qquad \text{Equation 3}$$

where $R_S$ is the source impedance.

In addition, at impedance match and also with $$\omega_0 \ll \frac{G_{mM}}{C_1},$$

the voltage amplitude at the output of the second transconductance amplifier 32 ($G_{mM}$) is given as per Equation 4 below:

Voltage amplitude at the output of the second transconductance amplifier 32

$$v_{OUT,GmM} \approx \frac{1}{\omega_0 C_1 R_S} v_{IN} \qquad \text{Equation 4}$$

where $V_{IN}$ is the voltage amplitude at the LNA input.

Figure 4:
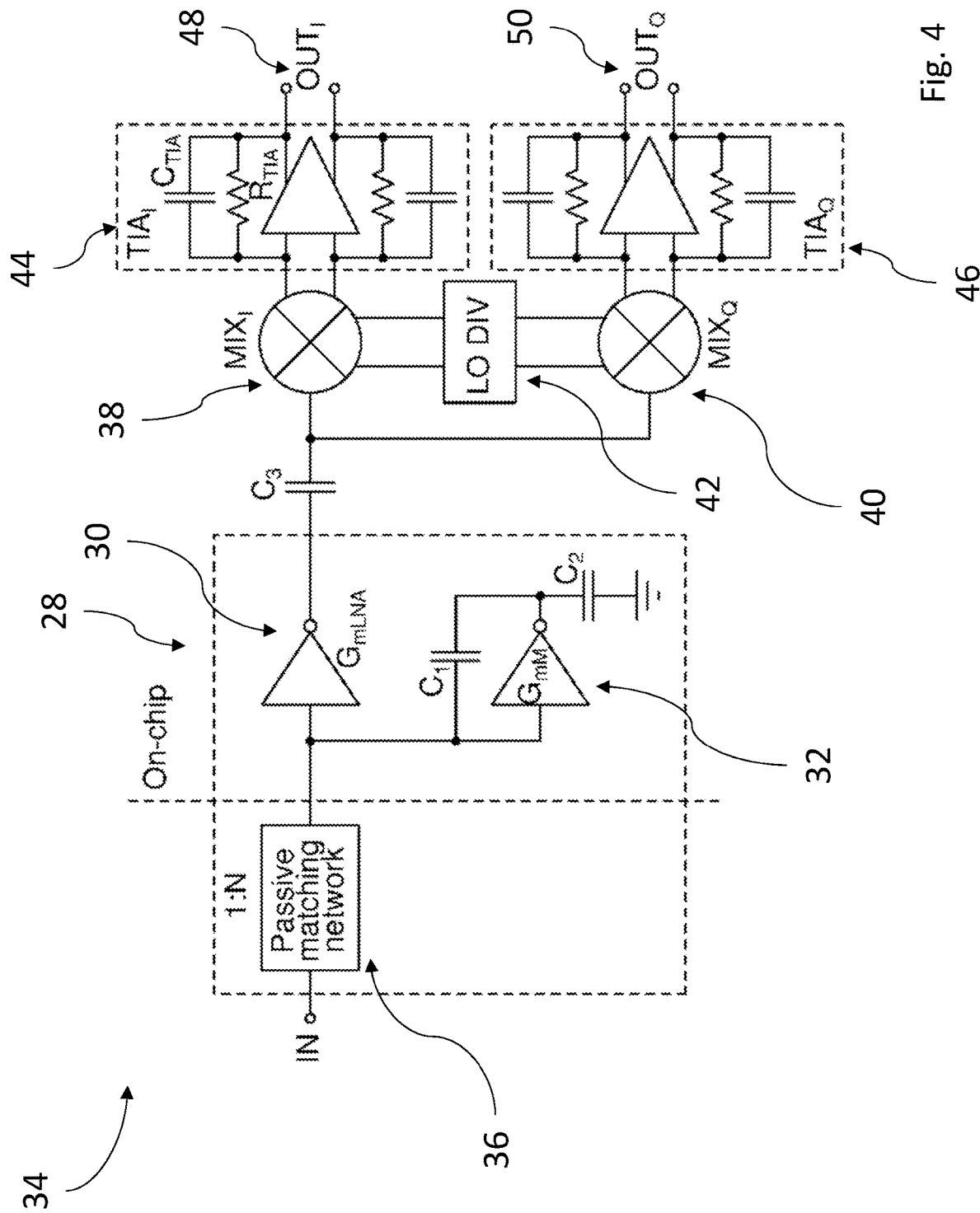
FIG. 4 is a circuit diagram of a radio receiver device that uses the LNA of FIG. 3A.

Importantly, no on-chip inductors are required in order to provide the input matching, i.e. the LNA 28 has no on-chip inductors. As can be seen in FIG. 4, when implemented within a radio receiver device 34, the LNA 28 may comprise an off-chip passive matching network 36. The input to the first transconductance amplifier 30 may be connected to the off-chip passive matching network 36, which may include any required inductors, as shown in FIG. 4.

A blocker signal presented at the input to the LNA 28 is also amplified to the output of the second transconductance amplifier 32 ($G_{mM}$). However, the gain of the second transconductance amplifier 32 can be much lower than a conventional CFB or RFB LNA, in which the LNA may typically provide around 20 dB voltage gain. In the LNA architecture illustrated in FIG. 3A, the voltage gain in the parallel CFB amplifier may typically be in the order of only 10-13 dB. Accordingly, this means that the parallel CFB amplifier compresses at a much higher input blocker power compared to the traditional RFB or CFB LNA known in the art per se.

Additionally, because the CFB amplifier (i.e. second transconductance amplifier 32 and capacitive feedback network $C_1$, $C_2$) is in parallel with the signal path, its compression is much less concern compared to the conventional RFB or CFB LNAs, in which the compression takes place at the signal path.

The noise figure (NF) of the LNA 28 shown in FIG. 3A can be approximated as per Equation 5 below:

Noise figure of the LNA 28

$$NF = 1 + \frac{\gamma}{G_{mM} R_S} + \frac{4\gamma}{G_{mLNA} R_S} = 1 + \frac{C_1}{C_1 + C_2} \gamma + \frac{4\gamma}{G_{mLNA} R_S} \qquad \text{Equation 5}$$

in which it is assumed that $R_{IN} = R_S$. It is also assumed that both of the transconductance amplifiers 30, 32 are realised using similar CMOS inverters but potentially with different values of transconductance, FET dimensions, etc.

In Equation 5, the second and last terms are due to the second transconductance amplifier 32 ($G_{mM}$) and first transconductance amplifier 30 ($G_{mLNA}$) respectively.

Without the capacitive feedback network $C_1$, $C_2$ (i.e. if the input and output terminals of the second transconductance amplifier 32 were connected to the input terminal of the first transconductance amplifier 30), the NF due to the second transconductance amplifier 32 alone would be as per Equation 6 below:

$$NF = 1 + \gamma \qquad \text{Equation 6: Noise figure due to the second transconductance amplifier 32 alone without the capacitive feedback network}$$

By comparing Equation 5 to the Equation 6, it can be seen that the noise due to the second transconductance amplifier 32 ($G_{mM}$) is reduced by a factor $C_1/(C_1+C_2)$ via the capacitive feedback network $C_1$, $C_2$.

In some applications, however, the resulting NF of the complete LNA 28 shown in FIG. 3A may be too high, e.g. for some cellular applications. In order to overcome this, the NF of the proposed LNA 28 can be decreased further by designing the resistance $R_{EQ}$ to be larger than the source resistance $R_S$ and by employing a passive impedance transformation network 36 to transform $R_{EQ}$ downwards to $R_S$. An example of this is shown in FIG. 4.

The ideally-lossless impedance matching network 36 amplifies the incoming RF voltage by a factor N, in which $N^2$ is the resistance matching ratio of $R_{EQ}$ and $R_S$ as per Equation 7 below:

The resistance matching ratio of $R_{EQ}$ and $R_S$ $$N^2 = \frac{R_{EQ}}{R_S} \qquad \text{Equation 7}$$

The impedance matching network 36 also tunes out the undesired capacitance of $C_{EQ}$ and all the other parasitic capacitance presented at the inputs of the transconductance amplifiers 30, 32. The NF of the complete LNA 28 with the passive impedance network 36 is then given as per Equation 8 below:

Noise figure of the LNA 28 together with
the off-chip impedance matching network $$NF = 1 + \frac{\gamma}{G_{mM} N^2 R_S} + \frac{4\gamma}{G_{mLNA} N^2 R_S} \qquad \text{Equation 8}$$

It is seen that the noise contributions of the first and second transconductance amplifiers 30, 32 are reduced by a factor $N^2$ compared to Equation 5.

The radio receiver device 34 of FIG. 4 is a direct conversion receiver. The first transconductance amplifier 30 ($G_{mLNA}$) having ideally large input and output impedances drives the in-phase and quadrature mixers 38, 40, while the parallel CFB amplifier (i.e. the second transconductance amplifier 32 ($G_{mM}$) with the capacitive feedback network $C_1$, $C_2$) provides the LNA input matching with the off-chip impedance matching network 36. Examples of the off-chip impedance matching network 36 are shown in FIGS. 5A and 5B.

The in-phase and quadrature mixers 38, 40 are connected to the output terminal of the first transconductance amplifier 30 via third capacitor C3, and are each provided with in-phase and quadrature reference signals generated by a local oscillator (LO) and divider 42. These mixers 38, 40 each drive a respective transimpedance amplifier 44, 46 that provides differential in-phase and quadrature output signals 48, 50 respectively. These transimpedance amplifiers 44, 46 have a topology known in the art per se and the structure and function of these is not described in detail here.

Thus the impedance matching network 36 amplifies the incoming RF voltage near the operation frequency by a factor of N, and it transforms the source resistance $R_S$ to a higher value of $R_{EQ}$ realised by the parallel CFB amplifier (i.e. the second transconductance amplifier 32 and capacitive feedback network $C_1$, $C_2$). The first transconductance amplifier 30 ($G_{mLNA}$) drives the passive current mode mixers 38, 40, which in turn drive the TIAs 44, 46. The voltage gain of the complete receiver 34 shown in FIG. 4 is then given as per Equation 9 below:

Voltage gain of the complete receiver 34 shown in FIG. 4

$$A_V = \left| \frac{v_{OUT,I}}{v_{IN}} \right| = N G_{mLNA} \frac{\sqrt{2}}{\pi} R_{TIA} \qquad \text{Equation 9}$$

where the factor of $$\frac{\sqrt{2}}{\pi}$$

corresponds to a mixer conversion loss with a 25% LO duty cycle.

Figure 13:
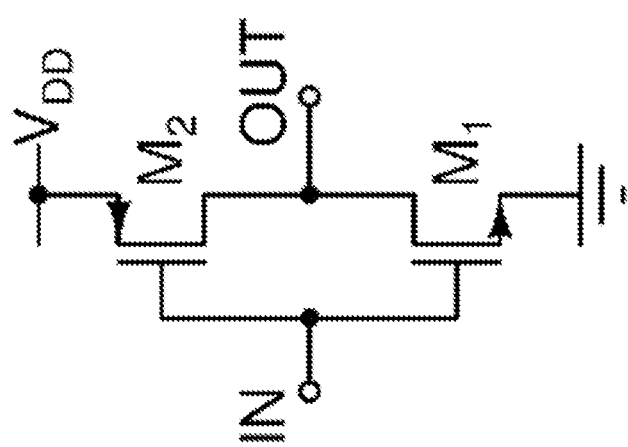
FIG. 13 is a circuit diagram of a CMOS inverter.

In the LNA 28 of the present invention, both of the transconductance amplifiers 30, 32 can each be implemented as a respective CMOS inverter, as shown in FIG. 13 with biasing details omitted, in which an NMOS transistor $M_1$ and PMOS transistor $M_2$ are arranged such that their gate terminals are connected together at an input node IN and their drain terminals are connected together at an output node OUT. The source terminal of the NMOS transistor $M_1$ is typically connected to ground and the source terminal of the PMOS transistor $M_2$ is typically connected to a positive supply rail $V_{DD}$. The same inverter topology may be used for each amplifier 30, 32, but typically with different FET dimensions, bias currents, etc.

As discussed previously, in practice, the gates of the NMOS transistor $M_1$ and the PMOS transistor $M_2$ are typically biased at different gate voltages. However, when operated at RF frequencies (which is of interest in here), the CMOS inverter effectively looks as shown in FIG. 13.

The output impedance of the first transconductance amplifier 30 ($G_{mLNA}$) at RF frequencies is usually much larger than the corresponding output impedance of a conventional CMOS RFB LNA.

In addition, at RF frequencies, it is usually the parasitic capacitance $C_P$ at the LNA output which limits both the LNA output impedance $Z_{O,LNA}$ at RF and the mixer output resistance $R_{O,MIX}$ at BB frequencies.

Figure 6:
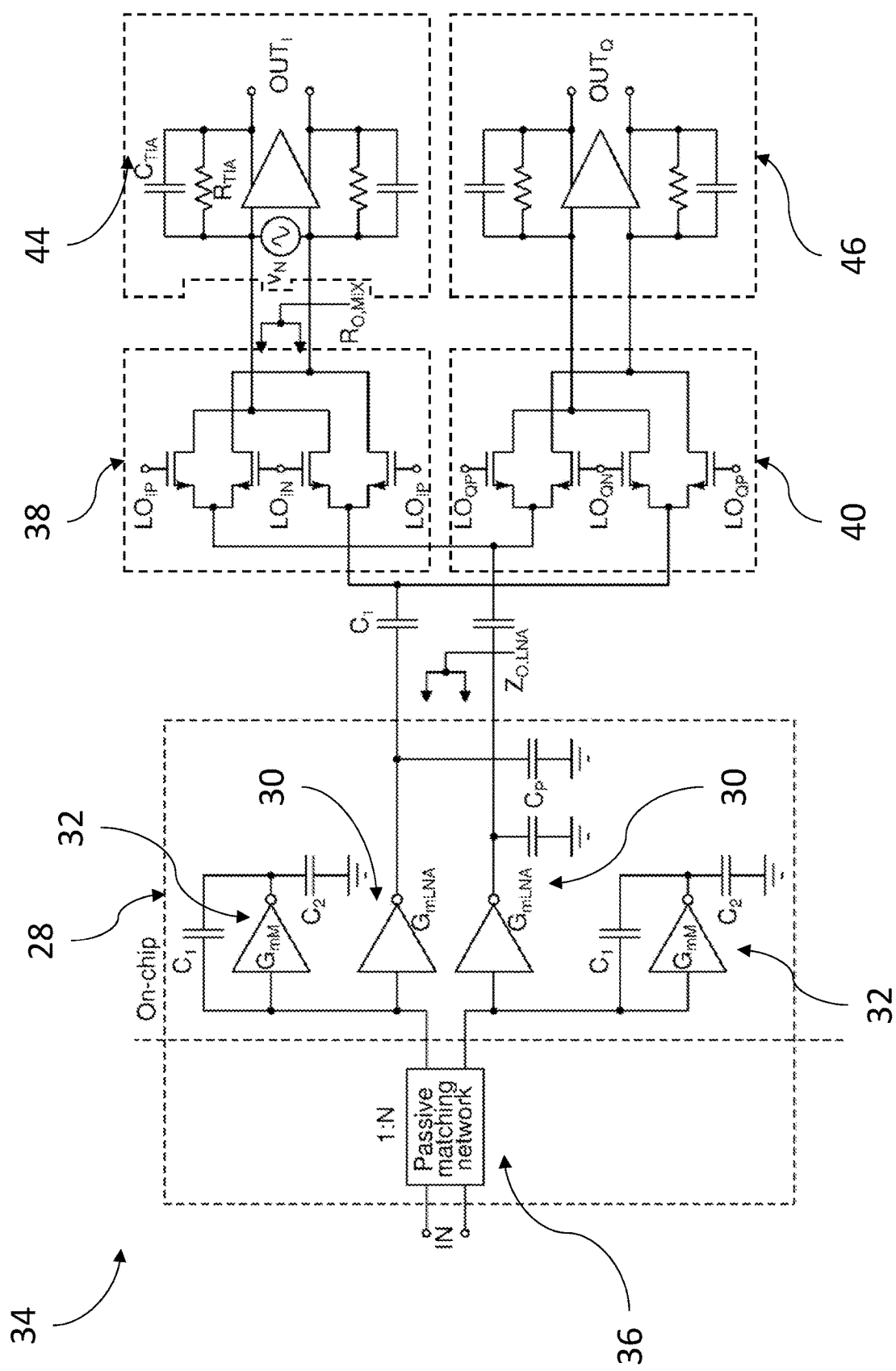
FIG. 6 is a circuit diagram of a model used to calculate the noise contribution of the TIA op-amps used with the radio receiver device of FIG. 4.

FIG. 6 is a circuit diagram of a model used to calculate the noise contribution of the TIA op-amps used with the radio receiver device of FIG. 4. Generally, where the analogue baseband (ABB) circuit following the mixer(s) is realized with 'balanced' (or 'differential') circuits, the signal can be considered to have both negative and positive 'branches'. As a result, both the I and Q phase down-converted signals have both positive and negative 'branches'.

In practice, the IQ mixers 38, 40 are driven by LO signals from the LO 42, where the LO signals have a 25% duty cycle. There are four constituent LO signals or 'phases', specifically wherein there is a positive and negative LO phase (a suffix of 'P' or 'N' respectively) for each of the in-phase and quadrature components (a suffix of 'I' or 'Q' respectively): $LO_{IP}$; $LO_{QP}$; $LO_{IN}$; and $LO_{QN}$. The 25% duty cycle means that while a single LO phase is high, the other three LO phases are low. The behaviour of the circuit with respect to these four LO phases is described briefly in turn.

Firstly, the differential transconductance amplifier 30 provides differential RF current at its output, which is routed to the TIA 44 while the LO phase $LO_{IP}$ is high and all other LO phases are low. Secondly, while the LO phase $LO_{QP}$ is high and all other LO phases are low, the differential RF current of the transconductance amplifier 30 is routed to the TIA 46. Thirdly, while the LO phase $LO_{IN}$ is high and all other LO phases are low, the differential RF current of the transconductance amplifier 30 is routed to the TIA 44, but now with inversion compared to the case when $LO_{IP}$ was high. Finally, when the LO phase $LO_{QN}$ is high and all other LO phases are low, the differential RF current of the transconductance amplifier 30 is routed to the TIA 46, but now with inversion compared to the case when $LO_{QP}$ was high.

The output resistance of the passive current mode mixer in the direct conversion receiver 34 that employs the (differential) LNA 28 in accordance with an embodiment of the present invention can be analysed by considering the circuit shown in FIG. 6.

Due to the switched-capacitor (SC) effect, the parasitic capacitance ($C_P$) at the output of the LNA 28 limits the mixer output resistance $R_{OUT,MIX}$ as per Equation 10 below:

Mixer output resistance $R_{OUT,MIX}$ $$R_{OUT,MIX} = 2\left(\frac{1}{4f_{LO}C_P} + 2R_{SW}\right) \quad \text{Equation 10}$$

where $f_{LO}$ is the LO frequency or RF operation frequency and $R_{SW}$ is the ON-resistance of a single mixer switch.

In practice, the mixer output resistance with the LNA 28 of FIG. 3A having a transconductance stage (i.e. the first transconductance amplifier 30, $G_{mLNA}$) with a large output impedance is much larger than the corresponding mixer output resistance with a conventional RFB (or CFB) LNA known in the art per se.

Accordingly, by employing the disclosed LNA in a direct conversion receiver, the noise contributions and DC-offsets of the TIAs can be reduced to a much lower level compared to a receiver in which the conventional RFB (or CFB) LNA is used.

With the disclosed architecture of the LNA 28, the actual amplifier (i.e. the first transconductance amplifier 30, $G_{mLNA}$) driving the current mode mixers 38, 40 is realized as voltage-to-current amplifier (i.e. transconductance amplifier), which has large input and output resistance. Via frequency translation in the mixers 38, 40, the large output impedance of the LNA 28 is translated to a large current mode passive mixer output resistance, which lowers the noise and DC-offsets due to the TIAs 44, 46. In addition, via frequency translation by the current mode passive mixers 38, 40, the low input impedance of TIAs 44, 46 is translated to the mixer RF input and therefore to the output of the first transconductance amplifier 30, which improves the linearity of the LNA 28. That is, the out-of-band blocking signals create a small voltage swing at the output of the first transconductance amplifier 30, which improves the linearity of the entire receiver 34.

Similarly, the blocking signals presented at the input of the LNA 28 are amplified to the output of the second transconductance amplifier 32 but with much lower voltage gain compared to a conventional RFB or CFB LNA, which creates less compression at the output of the second transconductance amplifier 32. Moreover, because the CFB amplifier that provides the input matching appears in parallel with the actual signal path, its compression is much less concern compared to conventional RFB or CFB LNAs, in which the compression takes place at the signal path. As a result, the LNA of the present invention may achieve much higher linearity at low supply voltage compared to prior art RFB or CFB LNAs.

The off-chip impedance matching network 36 of FIGS. 5A and 5B is constructed from a parallel inductance $L_M$ and a series capacitor $C_M$ that transform the source resistance $R_S$ upwards to $R_{EQ}$. That is, the impedance transformation ratio is $N^2$ (see (20)) and the matching network amplifies the incoming RF voltage by a factor of N. It will of course be appreciated that this matching network 36 is only exemplary and other similar networks can be employed. The off-chip matching network 36 consisting of $L_M$ and $C_M$ is preferable to using an on-chip matching network, especially because the off-chip inductor $L_M$ can achieve a much higher Q-factor and lower loss compared to on-chip inductors used in conventional LNA arrangements. Accordingly, the LNA with off-chip matching network can achieve a lower NF than the LNA employing completely integrated input matching.

In the presented LNA 28 described above, the matching network transformation ratio $N^2$ and voltage gain N are generally chosen to be sufficiently large so as to lower the NF of the LNA 28 and receiver 34, however too large a value of N may degrade the linearity of the LNA 28. As the value of N is chosen, the values of the respective transconductance values $G_{mLNA}$ and $G_{mM}$ of the first and second transconductance amplifiers 30, 32 are selected to obtain a desired NF for the LNA 28 and receiver, and to tune the voltage gain of the receiver 34. In addition, once N and $G_{mM}$ are known, the values for $C_{EQ}$ and $R_{EQ}$ may be determined.

In the passive off-chip matching network 36, the value of the off-chip matching inductor $L_M$ sets the input resistance of the LNA 28 to the source impedance $R_S$. The value of $L_M$ can be approximated as per Equation 11 below:

Inductance of passive
off-chip impedance matching network 36

$$L_M = \frac{NR_S}{\omega_0 + \omega_0^2 C_{EQ} NR_S} \quad \text{Equation 11}$$

where $\omega_0$ is the (angular) operation frequency and $C_{EQ}$ is the equivalent capacitance presented at the inputs of $G_{mM}$ and $G_{mLNA}$ (see Equation 2).

On the other hand, the value of the off-chip matching capacitor $C_M$ is chosen to cancel the imaginary part of the input impedance of the LNA 28 and to fulfil the following resonance condition at the frequency interest as per Equation 12:

Resonance condition at frequency of interest $$\omega_0^2 = \frac{1}{(C_M + C_{EQ})L_M} \quad \text{Equation 12}$$

from which the value of the off-chip matching capacitor is given per Equation 13:

Capacitance of passive
off-chip impedance matching network 36

$$C_M = \frac{1}{\omega_0^2 L_M} - C_{EQ} \quad \text{Equation 13}$$

In principle, the matching network 36 consisting of two components of $L_M$ and $C_M$ is able to realise the LNA input matching only at the single operation frequency $f_0$, or in practice at a relatively narrow frequency band. This can be seen from Equations 11 to 13, in which the calculated values for $L_M$ and $C_M$ are functions of $\omega_0$ and thus may vary at other frequencies.

In practice, the bandwidth, at which the LNA input matching is acceptable, depends on the desired impedance transformation ratio ($N^2$). The large impedance matching ratio translates to the narrow input matching bandwidth and vice versa. Thus, in order to provide robust LNA input matching, the impedance matching ratio $N^2$ may be capped at a maximum of around 10, resulting in reasonable matching bandwidth. However, modifications to the topology for multiband applications are described below.

Figures 7A, 7B:
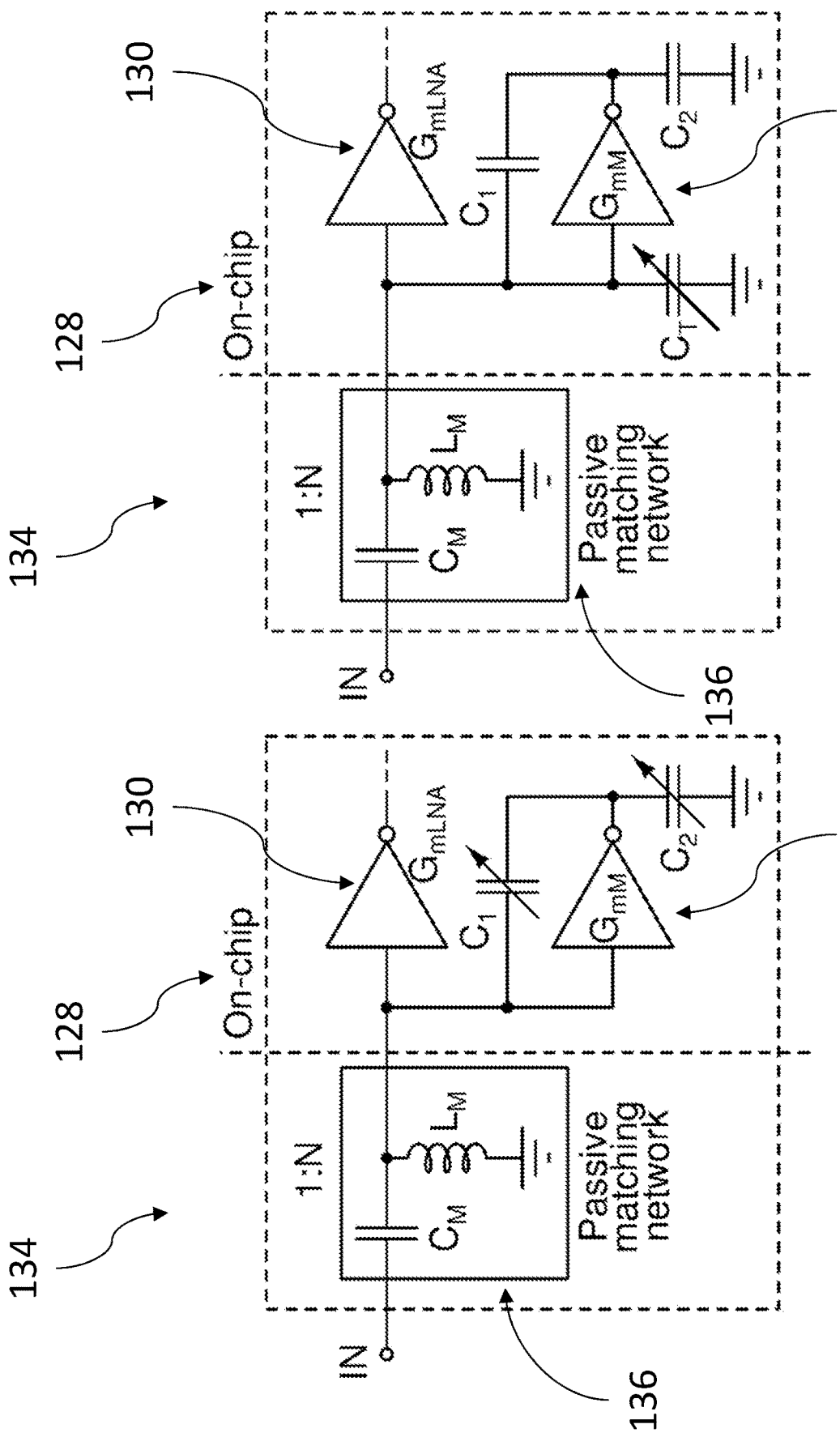
FIGS. 7A and 7B are circuit diagrams of an LNA for a multiband receiver.

FIGS. 7A and 7B are circuit diagrams of an LNA 128 for a multiband receiver 134. These arrangements make use of variable capacitors (or varactors) in order to tune the receiver 134 between different operating frequencies. Generally, these variable capacitors are capacitor matrices.

Firstly, the arrangement shown in FIG. 7A provides multiband operation by making the capacitance of the capacitors $C_1$ and $C_2$ in the capacitive feedback network variable. In particular, the values of $C_1$ and $C_2$ are configured in such a way that the ratio $C_1/(C_1+C_2)$ remains substantially constant while $C_{EQ}$ varies at different operation frequency bands. The constant value of $C_1/(C_1-C_2)$ provides the substantially constant value of $R_{EQ}$ (see Equation 1) and matching network voltage gain N at all frequency bands.

In order to achieve this, at the highest frequency band of interest, $C_{EQ}$ is set to its lowest value and the values for the matching components $L_M$ and $C_M$ are obtained from Equation 11 and Equation 13 respectively, and through simulation. After this, the values of $L_M$ and $C_M$ are fixed. Next, at the lower frequency bands, the value for $C_{EQ}$ is tuned (e.g. increased) so as to cancel the imaginary part of the input impedance of the LNA 128 and to tune the resonance of the input impedance of the LNA 128 to the corresponding (lower) operation frequency. In other words, for a given operation frequency with fixed $L_M$ and $C_M$, the value for $C_{EQ}$ can be approximated from Equation 12 as per Equation 14 below:

Equivalent capacitance $C_{EQ}$ for a given operation frequency $$C_{EQ} = \frac{1}{\omega_0^2 L_M} - C_M \qquad \text{Equation 14}$$

Thus at the lower operation frequency bands, a higher value for $C_{EQ}$ is employed.

FIG. 7B shows an alternative approach in which a configurable capacitor $C_T$ is introduced at the input terminals of the first and second transconductance amplifiers 130, 132, and whose value is adjusted depending on the operation frequency. This technique also allows constant value of $R_{EQ}$ (see Equation 1) and matching network voltage gain N at all frequency bands. On the other hand, the values of the matching inductance $L_M$ and capacitance $C_M$ are now altered as per Equations 15 and 16 respectively:

Matching inductance with introduction of variable capacitor $C_T$ $$L_M = \frac{NR_S}{\omega_0 + \omega_0^2(C_{EQ} + C_T)NR_S} \qquad \text{Equation 15}$$

Matching capacitance with introduction of variable capacitor $C_T$ $$C_M = \frac{1}{\omega_0^2 L_M} - C_{EQ} - C_T \qquad \text{Equation 16}$$

In order to provide multiband operation, the approach with the arrangement of FIG. 7B is similar to that of FIG. 7A described above. At the highest frequency band of interest, $C_T$ is set to its lowest value and the values for the matching components $L_M$ and $C_M$ are obtained from Equations 15 and 16 above, and through simulation. Then, the values of $L_M$ and $C_M$ are fixed. At the lower frequency bands, the value for $C_T$ is tuned (e.g. increased) to cancel the imaginary part of the input impedance of the LNA 128 and to tune the resonance of the LNA input impedance to the corresponding operation frequency. For given operation frequency with fixed $L_M$ and $C_M$, the value for $C_T$ can be approximated from Equation 16 as per Equation 17 below:

Capacitance of $C_T$ for a given operation frequency $$C_T = \frac{1}{\omega_0^2 L_M} - C_M - C_{EQ} \qquad \text{Equation 17}$$

It can be seen that lower operation frequency bands require a higher value for $C_T$.

Both of the LNA topologies shown in FIGS. 7A and 7B adjust a capacitance value to achieve multiband operation. In practice, adjusting the capacitance can be accomplished on-chip by using varactors (i.e. a capacitor where the capacitance can be adjusted with a control voltage, i.e. an active device) or switched matrices of passive capacitors, i.e. 'capacitor matrices'. In many cases, switched matrices may be preferred as they are typically more linear than varactors. An example of such a switched capacitor matrix is described in further detail below with reference to FIG. 9B.

The capacitances of $C_1$ and $C_2$ may be determined as per Equations 18 and 19 below respectively:

Capacitance of $C_1$ $$C_1 = \frac{C_2}{G_{mM} R_{EQ} - 1} \qquad \text{Equation 18}$$

Capacitance of $C_2$ $$C_2 = G_{mM} R_{EQ} C_{EQ} \qquad \text{Equation 19}$$

Figure 8:
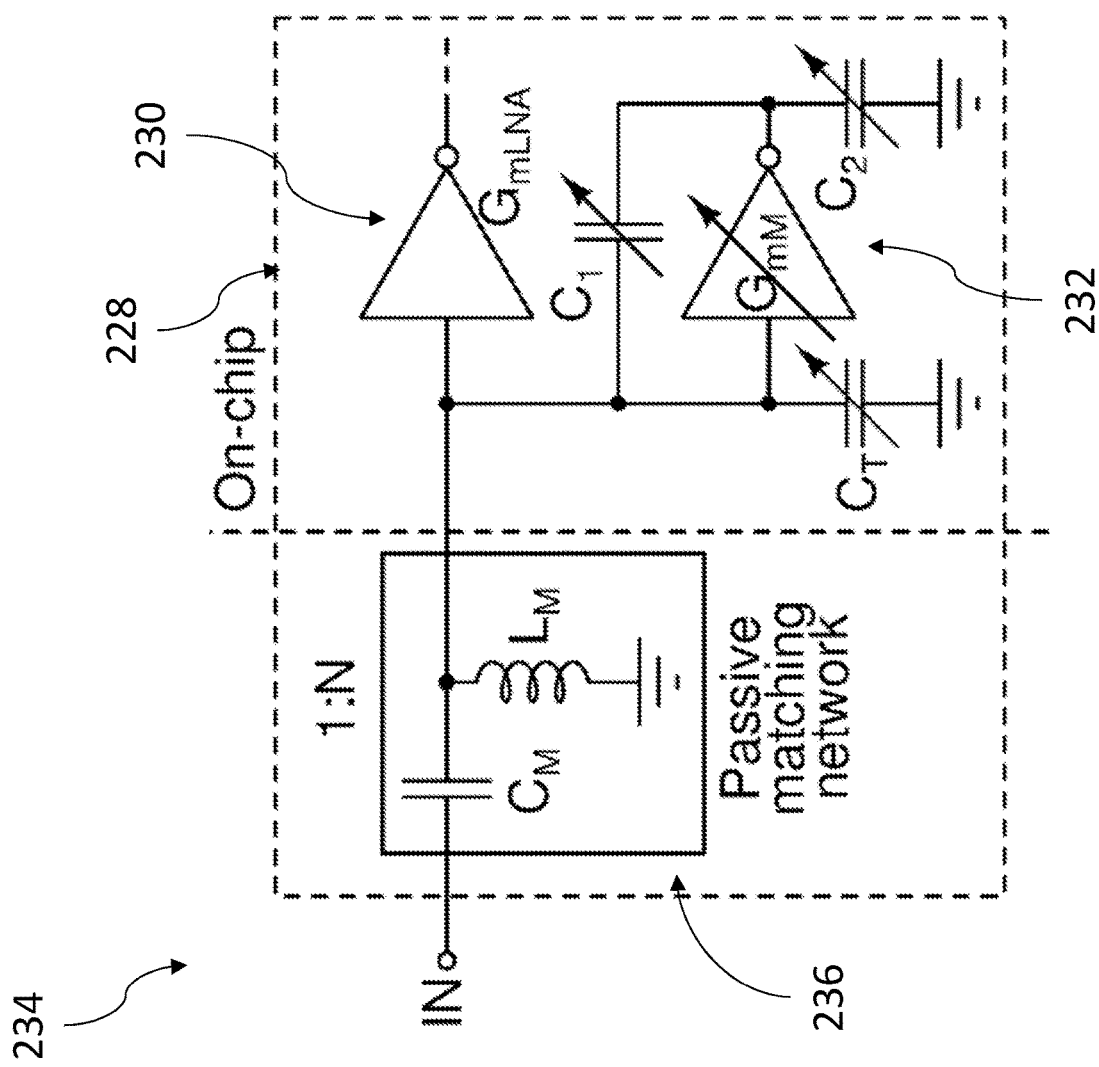
FIG. 8 is a circuit diagram of an LNA with a variable supply current in the second transconductance amplifier of the LNA.

FIG. 8 is a circuit diagram of an LNA 228 in which the second transconductance amplifier 232 has an adjustable supply current and, therefore, adjustable transconductance. Such an arrangement may be particular beneficial for battery-operated devices, as outlined below.

In some applications, when receiving a very weak desired RF signal, the wireless receiver 234 may be operated in a 'sensitivity mode' in which it needs to display a low NF in order to provide sufficiently large SNR at the receiver output. Above the sensitivity level, however, the strength of the desired RF signal may be sufficiently large that NF requirements for the receiver 234 may be relaxed while still maintaining a sufficient SNR at the output of the receiver 234. As such, the wireless receiver device 234 may rely on automatic gain control, in which the receiver NF and gain is controlled based on the strength of the received signal.

In the presence of a sufficiently large desired signal at the input to the receiver 234 or LNA 228, the receiver 234 may be set to a 'low power' mode with higher NF (compared to the sensitivity mode) and its power consumption may be also scaled down. This may be especially advantageous for battery-operated device applications, in which low power consumption translates to long life-time of battery.

Accordingly, in the LNA 228 of FIG. 8, the supply current consumed by the second transconductance amplifier 232 that provides the LNA input matching can be varied. In particular, the transconductance ($G_{mM}$) of the second transconductance amplifier 232 is scaled down while the level of the desired RF signal at the input of the LNA 228 is sufficiently large. Scaling down the value of the transconductance ($G_{mM}$) of the second transconductance amplifier 232 also scales down the supply current, and thus the power consumption, of the second transconductance amplifier 232.

The actual scaling of the second transconductance amplifier 232 can be performed for instance by switching off parallel unit stages, which decreases the supply current consumed by the second transconductance amplifier 232 accordingly.

In the LNA 228 of FIG. 8, the scaling of this transconductance $G_{mM}$ is performed while keeping $R_{EQ}$ and $C_{EQ}$ constant, which advantageously leaves the LNA input matching and the gain of the matching network (N) unchanged as the current varies. When the value of the transconductance $G_{mM}$ of the second transconductance amplifier 232 is changed, the capacitance values of capacitors $C_1$ and $C_2$ may also need to be changed accordingly so as to ensure constant values of $R_{EQ}$ and $C_{EQ}$. With a constant $R_{EQ}$ and $C_{EQ}$, the values for capacitors $C_1$ and $C_2$ can be estimated from Equations 1 and 2 as $G_{mM}$ is varied.

In other words, if the transconductance $G_{mM}$ of the second transconductance amplifier 232 is changed, for example reduced, the values of both $C_1$ and $C_2$ must be changed in order leave $R_{EQ}$ and $C_{EQ}$ unchanged. This can be implemented using switched capacitor matrices, as shown in FIG. 8. As the LNA 228 shown in FIG. 8 employs configurable capacitor $C_T$ at the inputs of the transconductance amplifiers 230, 232, it is able to tune also to multiple frequency bands.

Figures 9A, 9B:
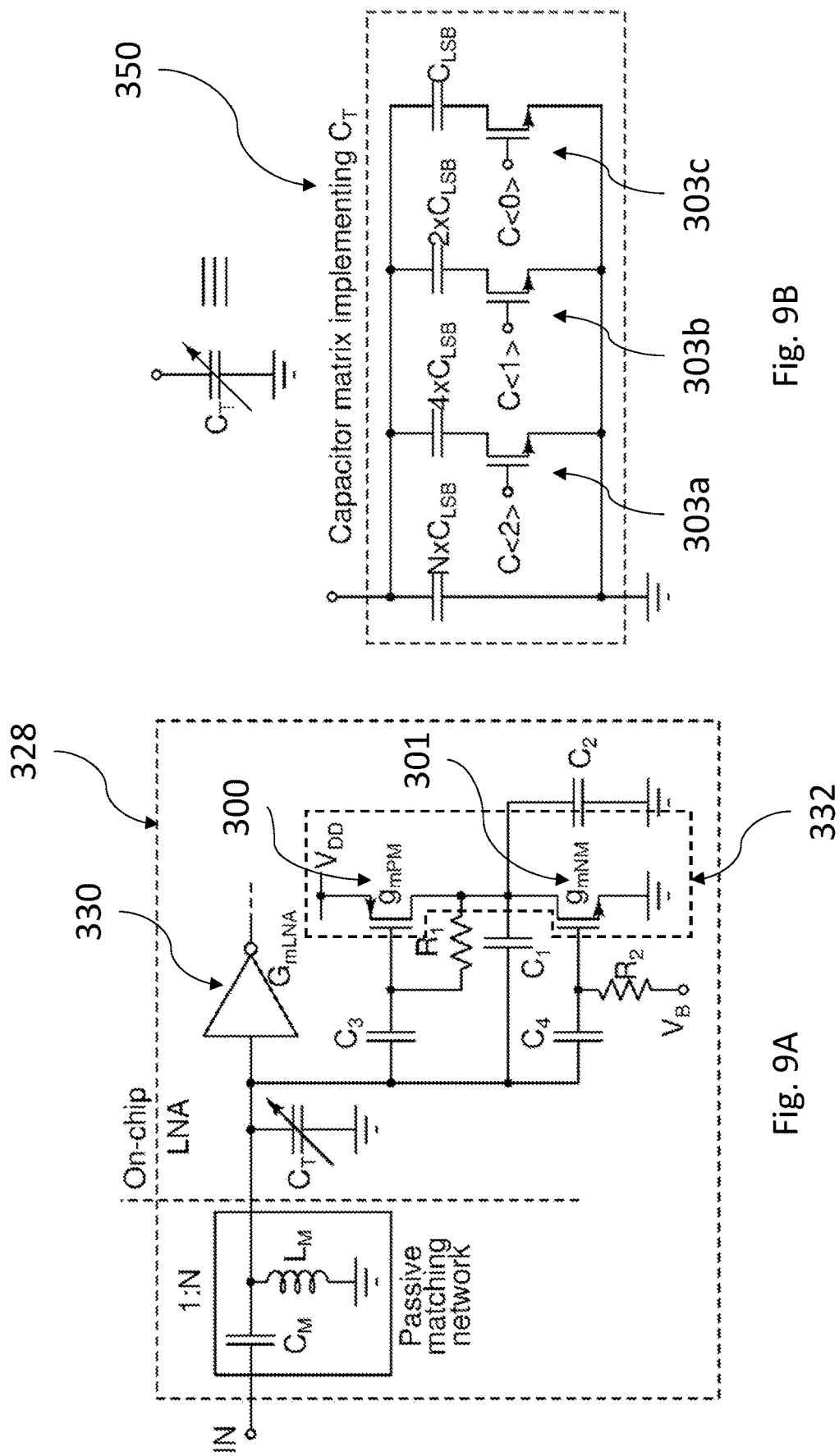
FIG. 9A is a circuit diagram illustrating the biasing used in the second transconductance amplifier of the LNA.
FIG. 9B is a circuit diagram of a variable capacitor matrix for use in a multiband LNA.

FIG. 9A is a circuit diagram illustrating the biasing used in an LNA 328 in accordance with an embodiment of the present invention. In the particular example shown, the LNA 328 is single-ended, however it may be of course be differential instead.

In particular, FIG. 9A shows a simplified circuit-level schematic of the second transconductance amplifier 332, in which only one setting for supply current is shown for simplicity. The second transconductance amplifier 332 is constructed as a CMOS inverter made from a PMOS transistor 300 and an NMOS transistor 301. The capacitors $C_1$ and $C_2$ form the capacitive feedback network and the sum of the respective transconductances of the saturation-region PMOS transistor 300 and NMOS transistor 301, i.e. $g_{mPM}$ and $g_{mNM}$, equals the transconductance $G_{mM}$ of the second transconductance amplifier 332. The voltage $V_B$ is the DC gate bias voltage of the NMOS transistor 301.

The resistors $R_1$ and $R_2$ are biasing resistors having large resistance, and their resistance does not, in practice, affect the performance of the input matching circuit when the resistance is selected to be sufficiently large, e.g. 20 kΩ. Also provided are a pair of AC-coupling capacitors $C_3$ and $C_4$. The bias voltage $V_B$ and the dimensions of the NMOS device 301 define the supply current of the second transconductance amplifier 332 as the PMOS transistor 300 forms a diode-connected device with $R_1$ from the biasing point of view or at DC. This ensures a well-defined DC voltage at the output node of the second transconductance amplifier 332 (i.e. at the drains of the CMOS transistors 300, 301). However, for RF signals at RF frequencies, both P- and NMOS transistors 300, 301 act as common-source amplifiers, forming a push-pull transconductance stage. The supply current may be minimised by using a push-pull structure with stacked PMOS and NMOS devices in the same current branch.

In the LNA 328 of FIG. 9A, the multiband operation or configurable operation frequency is implemented with a programmable capacitor matrix $C_T$. An example of this capacitor matrix 350 is shown in FIG. 9B, which is a circuit diagram of a variable capacitor matrix for use in a multiband LNA. Although FIG. 9B is shown to illustrate a variable capacitor $C_T$, a similar topology can be used to implement adjustable values for $C_1$ and $C_2$ used in the capacitive feedback in embodiments that employ such variable capacitors for those components, e.g. as shown in FIG. 7A.

In this arrangement, the capacitor matrix 350 uses three control bits (C<2:0>) and a fixed capacitance of $N \cdot C_{LSB}$ (LSB=least significant bit) is shown as an example. All of the capacitors are implemented as multiple units of $C_{LSB}$.

The capacitor matrix 350 shown as an example in FIG. 9B allows for eight different values of capacitance and accordingly, eight different values can be set for the operation frequency. For example, when all of the controls bits are high (C<2:0>='111'), all three of the control NMOS switches 303a-c conduct and the total capacitance is $C_T = (7+N)C_{LSB}$. This corresponds to the lowest operation frequency. On the other hand, when all controls bits are low (C<2:0>='0001') all the three control NMOS switches 303a-c are not conducting and the total capacitance is $C_T = NC_{LSB}$. With this setting, the highest operation frequency is set. Of course, operation frequencies in between these extremes may be achieved by setting some but not all of the three control NMOS switches 303a-c to conduct.

Figure 10:
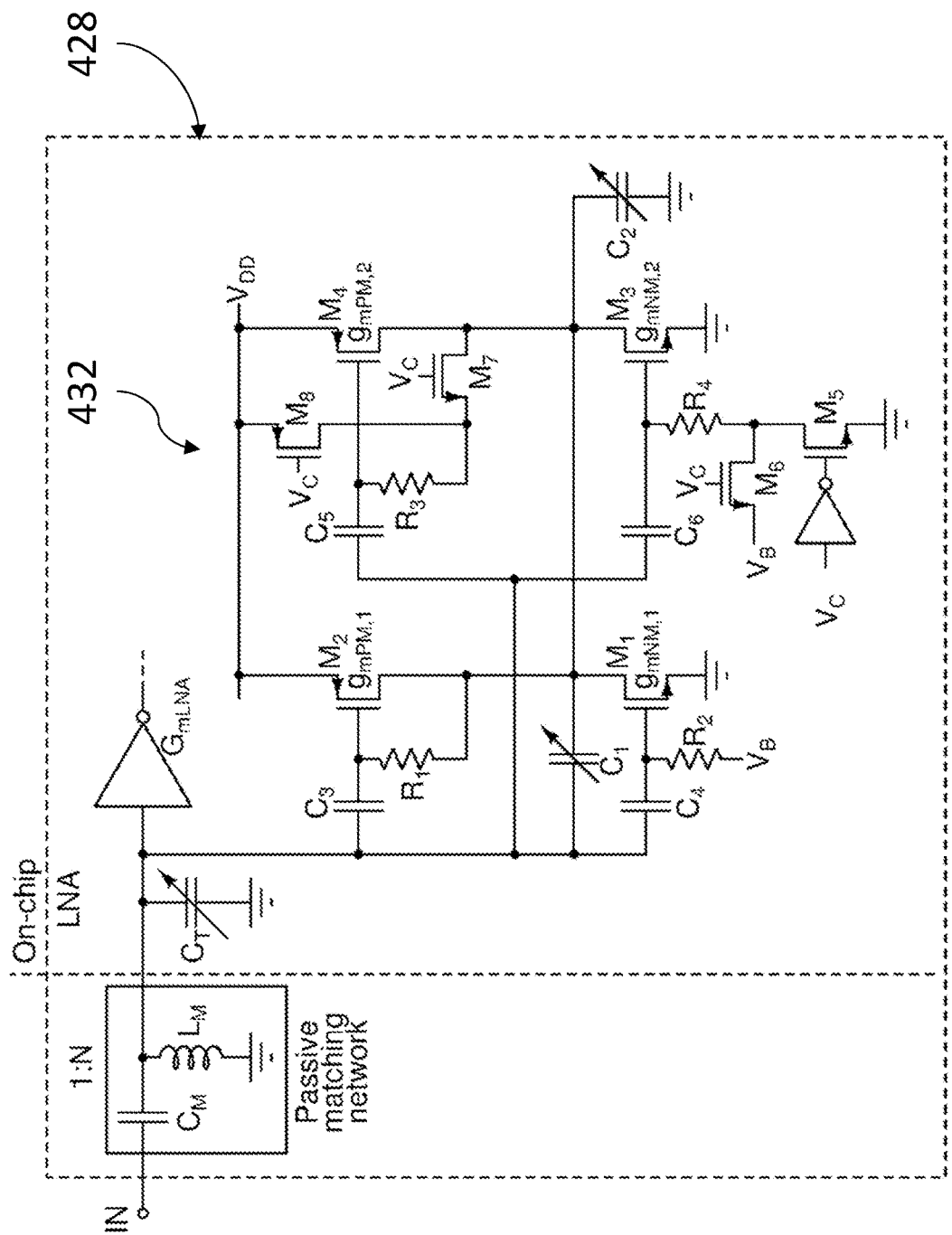
FIG. 10 is a circuit diagram of an LNA having two different power modes.

FIG. 10 is a circuit diagram of an LNA 428 having two different power modes. The resistors $R_1$-$R_4$ are biasing resistors having large resistance, the capacitors $C_3$ to $C_6$ are AC-coupling capacitances, and $M_5$ to $M_8$ are controls switches.

When the control voltage $V_C$ is high or $V_C = V_{DD}$, both of the parallel branches are active, providing the maximum value of the transconductance $G_{mM} = (g_{mNM,1} + g_{mNM,2} + g_{mPM,1} + g_{mPM,2})$ of the second transconductance amplifier 432 and, therefore, a low NF. In this mode, the switch transistors $M_6$ and $M_7$ are closed (conducting) and $M_5$ and $M_8$ are open.

When $V_C$ is low or $V_C = 0$ V, one branch is switched off, which decreases the supply current at the expense of higher NF. In this mode, $M_5$ and $M_8$ are closed (conducting) and $M_6$ and $M_7$ are open. The gates of $M_3$ and $M_4$ are connected to 0 V and $V_{DD}$, respectively, thereby switching these two devices off and decreasing the supply current accordingly. In this mode, the transconductance of the second transconductance amplifier 432 $G_{mM} = (g_{mNM,1} + g_{mPM,1})$ and the values of $C_1$ and $C_2$ need to be adjusted according to Equations 18 and 19 above.

The mode with lower supply current and higher NF could be used when the desired signal is not near the sensitivity level and a higher receiver and LNA NF can be tolerated. In FIG. 10, NMOS and PMOS switches are shown for simplicity, however in practice these could be replaced with CMOS switches, or NMOS devices could be replaced with PMOS transistors, and vice versa, depending on the particular implementation in use e.g. biasing, supply, and transistor threshold voltages, etc. Although only two modes of operation are shown, more than two modes can be implemented by adding more switched parallel CMOS stages.

Figure 11:
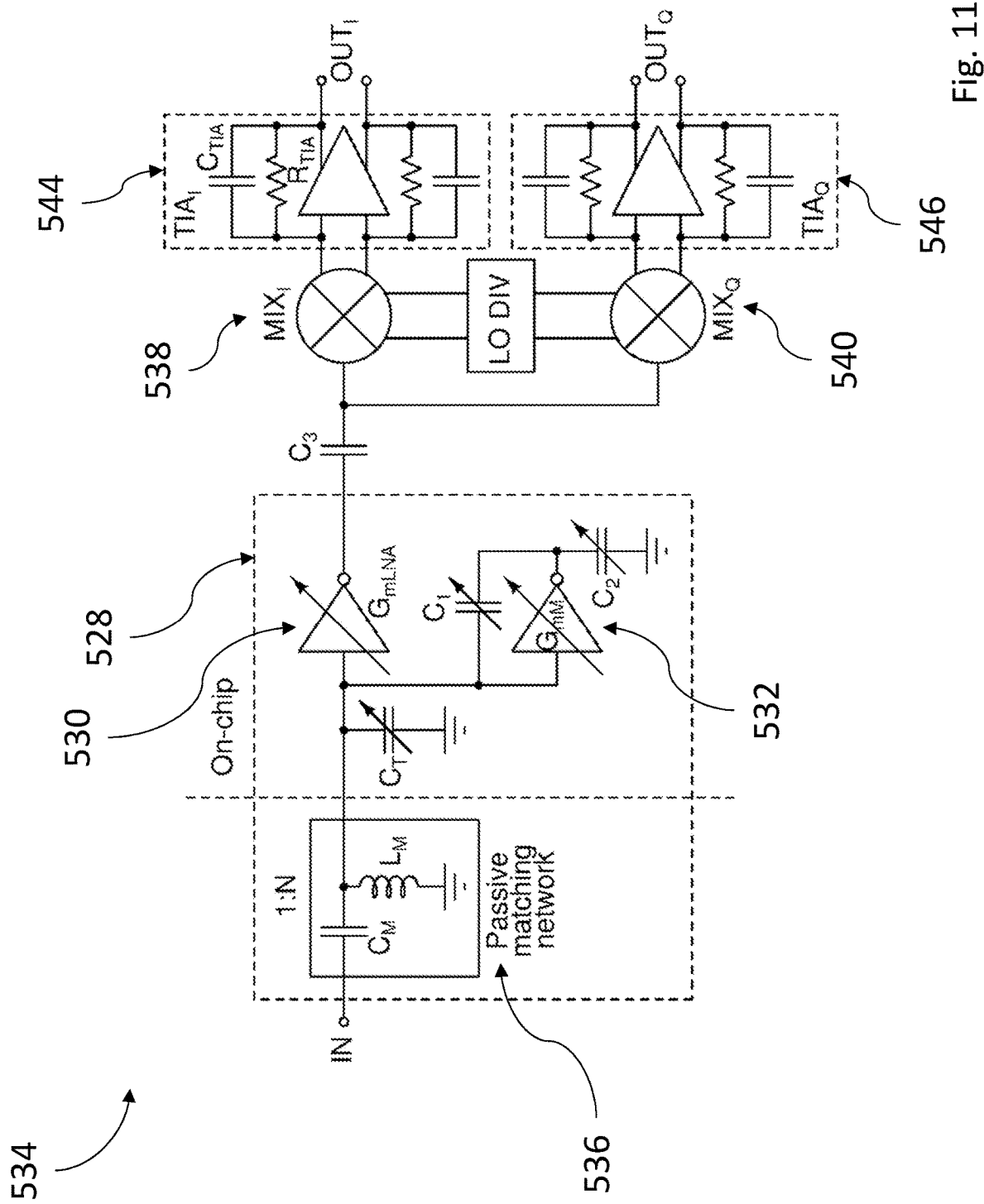
FIG. 11 is a circuit diagram of a single-ended multiband LNA with programmable supply current employed in an on-chip inductor-less radio receiver with single-balanced passive current-mode IQ down conversion mixers.

FIG. 11 is a circuit diagram of a single-ended multiband LNA 528 with programmable supply current employed in an on-chip inductor-less radio receiver 534 with single-balanced passive current-mode IQ down conversion mixers 538, 540. As with the other LNA architectures described herein, the LNA of FIG. 11 can be realised both as either a single-ended or differential circuit as required.

The multiband operation is achieved with switched capacitor matrix $C_T$ and the supply current of the input matching circuit can be adjusted according to the power of desired RF input signal with a second transconductance amplifier having a programmable transconductance $G_{mM}$ and switched capacitor matrices $C_1$ and $C_2$ in the capacitive feedback network, as described previously.

A programmable voltage gain in the receiver can be implemented in the actual amplifying transconductance stage, i.e. the first transconductance amplifier 530 can have a programmable transconductance $G_{mLNA}$, as is indicated with an arrow. The capacitor $C_3$ is an AC-coupling capacitor, which is advantageous when the DC voltages at the LNA output and mixer input are not necessarily the same, and this capacitor $C_3$ may also attenuate any low-frequency $2^{nd}$ order intermodulation distortion generated in the stages before the down conversion mixers 538, 540, which in turn drive the TIAs 544, 546. The capacitor $C_3$ also prevents any DC current flowing to the passive mixer switches, which is important to ensure that the mixer switches do not generate any flicker noise. The input impedance matching network 536 components are off-chip for low loss and low NF. Advantageously, only a single RF input package pin is needed in this receiver 534.

Figure 12:
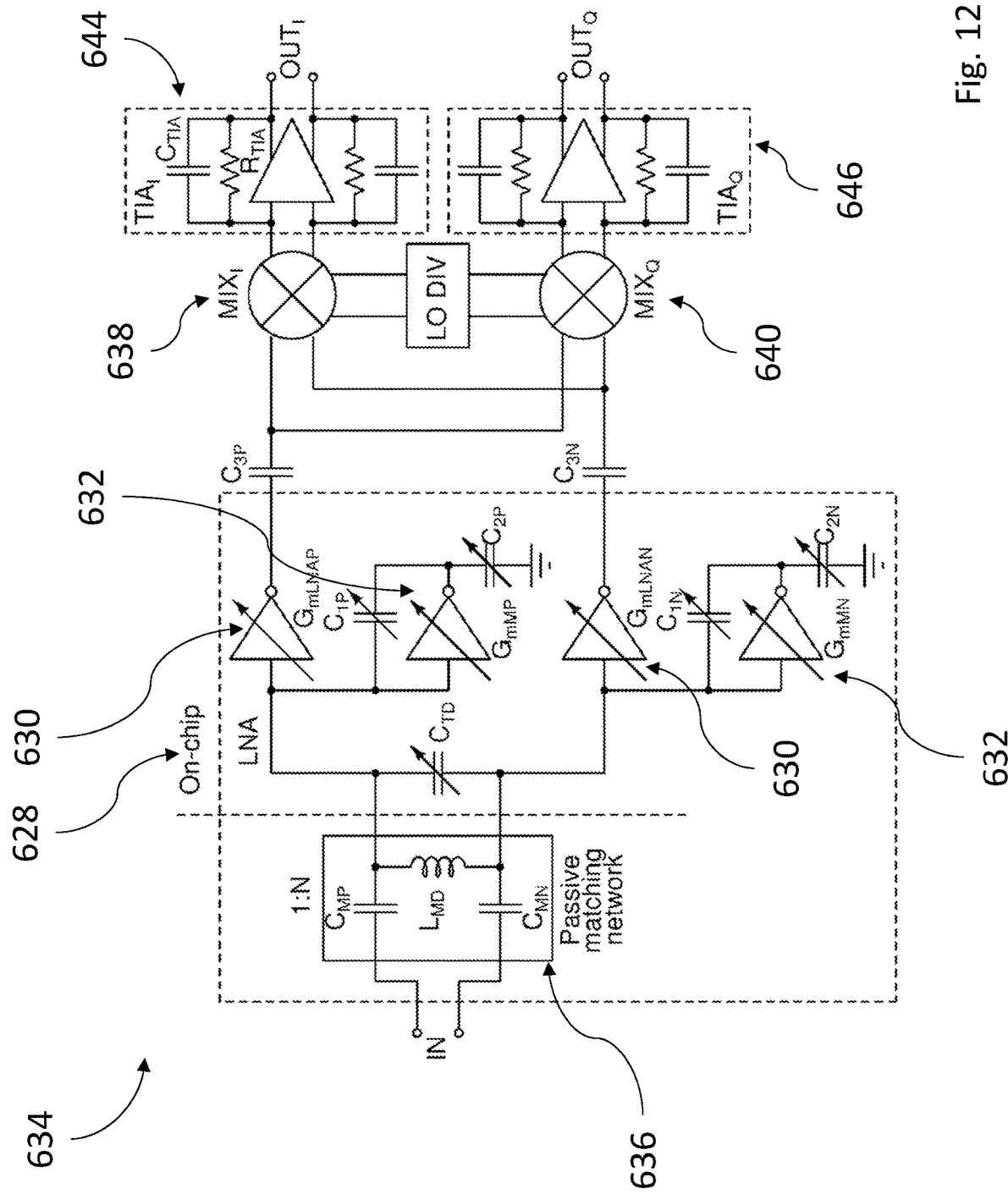
FIG. 12 is a circuit diagram of a differential multiband LNA with programmable supply current employed in an on-chip inductor-less radio receiver with double-balanced passive current-mode IQ down conversion mixers.

FIG. 12 is a circuit diagram of a differential multiband LNA 628 with programmable supply current employed in an on-chip inductor-less radio receiver with double-balanced passive current-mode IQ down conversion mixers. The LNA 628 includes: transconductance amplifiers 630, 632; mixers 638, 640; and TIAs 644, 646, which operate in a similar manner to the corresponding components outlined above.

For ease of description and explanation, the transconductance amplifiers for both the positive and negative branches are described together as they are identical in structure and function.

In the receiver 634 of FIG. 12, multiband operation is achieved with differential switched capacitor matrix $C_{TD}$. The supply current provided to the input matching circuit can be adjusted according to the power of desired RF input signal with a programmable second transconductance amplifiers 632 and switched capacitor matrices $C_{1P}$, $C_{2P}$, $C_{1N}$, and $C_{2N}$ in the parallel CFB amplifiers.

A programmable voltage gain in the receiver can be implemented in the actual amplifying transconductance stages—i.e. the first transconductance amplifiers 630 having respective transconductances $G_{mLNAP}$ and $G_{mLNAN}$—as indicated with arrows, where the indices P and N refer to positive and negative branches, respectively.

The capacitors $C_{3P}$ and $C_{3N}$ are AC-coupling capacitors as discussed previously.

The off-chip matching network 636 are constructed from series capacitors $C_{MP}$ and $C_{MN}$ and parallel inductance $L_{MD}$. Two RF input package pins may be required in this receiver and the number of off-chip components is increased from two to three due to the additional off-chip capacitor.

Thus it will be appreciated by those skilled in the art that embodiments of the present invention provide an on-chip inductor-less LNA architecture for wireless receivers. In the disclosed LNA topology, the LNA input matching is realised with the parallel CFB amplifier while another transconductance amplifier drives the current mode passive mixers with voltage-to-current conversion gain. As the receiver RF amplifying stage is implemented as a true transconductance amplifier ($G_{mLNA}$) with a large output impedance, a large passive current mode mixer output resistance is achievable, which may minimise the noise and DC offsets of the BB TIAs. Embodiments of the present invention may achieve a relatively high level of linearity at low supply voltages.

Those skilled in the art will appreciate that the specific embodiments described herein are merely exemplary and that many variants within the scope of the invention are envisaged.

The invention claimed is:

1. A low noise amplifier comprising:
 a first transconductance amplifier having an input terminal and an output terminal, said first transconductance amplifier being arranged to receive an input voltage at its input terminal and to generate an output current at its output terminal;
 a second transconductance amplifier having an input terminal and an output terminal, said second transconductance amplifier being arranged such that:
 the input terminal of the second transconductance amplifier is connected to the input terminal of the first transconductance amplifier; and
 the output terminal of the second transconductance amplifier is connected to the input terminal of the second transconductance amplifier via a capacitive feedback network;
 wherein the second transconductance amplifier comprises a current control circuit portion arranged to adjust a supply current drawn by said second transconductance amplifier.

2. The low noise amplifier as claimed in claim 1, wherein the first transconductance amplifier is feedback-less.

3. The low noise amplifier as claimed in claim 1, wherein the first and second transconductance amplifiers and the capacitive feedback network are arranged on a chip, optionally wherein the chip comprises a radio frequency integrated circuit (RFIC).

4. The low noise amplifier as claimed in claim 1, wherein the capacitive feedback network comprises a first capacitor connected between the input and output terminals of the second transconductance amplifier, and a second capacitor connected between the output terminal of the second transconductance amplifier and a reference voltage.

5. The low noise amplifier as claimed in claim 4, wherein the reference voltage is ground.

6. The low noise amplifier as claimed in claim 4, wherein a ratio between the respective capacitance value of the first capacitor to a sum of the capacitance values of the first and second capacitors of the capacitive feedback network is constant.

7. The low noise amplifier as claimed in claim 4, wherein a respective capacitance value of the first capacitor and/or the second capacitor of the capacitive feedback network is configurable.

8. The low noise amplifier as claimed in claim 7, wherein the first capacitor and/or the second capacitor comprises a capacitor matrix.

9. The low noise amplifier as claimed in claim 4, wherein the capacitive feedback network comprises a third capacitor connected between the input terminal of the second transconductance amplifier and the reference voltage.

10. A low noise amplifier comprising:
   a first transconductance amplifier having an input terminal and an output terminal, said first transconductance amplifier being arranged to receive an input voltage at its input terminal and to generate an output current at its output terminal;
   a second transconductance amplifier having an input terminal and an output terminal, said second transconductance amplifier being arranged such that:
   the input terminal of the second transconductance amplifier is connected to the input terminal of the first transconductance amplifier; and
   the output terminal of the second transconductance amplifier is connected to the input terminal of the second transconductance amplifier via a capacitive feedback network;
   wherein each transconductance amplifier comprises an inverter cell comprising a PMOS transistor and an NMOS transistor, arranged such that:
   a gate terminal of the PMOS transistor is connected to a gate terminal of the NMOS transistor at an inverter input terminal;
   a drain terminal of the PMOS transistor is connected to a drain terminal of the NMOS transistor at an inverter output terminal;
   a source terminal of the PMOS transistor is connected to a first rail; and
   a source terminal of the NMOS transistor is connected to a second rail.

11. The low noise amplifier as claimed in claim 10, wherein each of the gate terminals of the PMOS and NMOS transistors is connected to the inverter input terminal via respective DC blocking capacitor.

12. The low noise amplifier as claimed in claim 10, wherein the inverter cell of the first transconductance amplifier is arranged such that the inverter input terminal is connected to the input terminal of the first transconductance amplifier, and such that the inverter output terminal is connected to the output terminal of the first transconductance amplifier.

13. The low noise amplifier as claimed in claim 10, wherein the inverter cell of the second transconductance amplifier is arranged such that the inverter input terminal is connected to the input terminal of the second transconductance amplifier, and such that the inverter output terminal is connected to the output terminal of the second transconductance amplifier.

14. The low noise amplifier as claimed in claim 10, wherein a transconductance of the PMOS transistor is substantially equal to a transconductance of the NMOS transistor.

15. The low noise amplifier as claimed in claim 1, further comprising an external passive impedance transformation network.

16. The low noise amplifier as claimed in claim 15, wherein the external passive impedance transformation network comprises a capacitor and an inductor, arranged such that:
   a first terminal of the capacitor is connected to the wireless reception portion;
   a second terminal of the capacitor is connected to the input terminal of the first transconductance amplifier;
   a first terminal of the inductor is connected to the second terminal of the capacitor and to the input terminal of the first transconductance amplifier; and
   a second terminal of the inductor is connected to ground.

17. A radio receiver device comprising the low noise amplifier as claimed in claim 1, said radio receiver device further comprising a wireless reception portion arranged to receive a wireless communication signal over a wireless interface, and to generate an input voltage in response to said received communication signal, wherein the input voltage is provided to the input terminal of the first transconductance amplifier.

18. The radio receiver device as claimed in claim 17, further comprising a mixer, wherein the low noise amplifier is arranged to drive said mixer, optionally wherein said mixer comprises a current-mode passive mixer.

19. The radio receiver device as claimed in claim 18, further comprising a transimpedance amplifier, wherein the output of the mixer is connected to an input of the transimpedance amplifier.

* * * * *